(12) United States Patent
Kobayashi et al.

(10) Patent No.: US 6,794,739 B2
(45) Date of Patent: Sep. 21, 2004

(54) SEMICONDUCTOR DEVICE, PROCESS FOR PRODUCTION THEREOF, AND ELECTRONIC EQUIPMENT

(75) Inventors: Hirotaka Kobayashi, Tokyo (JP); Toshiki Koyama, Kanagawa (JP)

(73) Assignee: Sony Corporation (JP)

( * ) Notice: Subject to any disclaimer, the term of this patent is extended or adjusted under 35 U.S.C. 154(b) by 7 days.

(21) Appl. No.: 10/258,791

(22) PCT Filed: Feb. 20, 2002

(86) PCT No.: PCT/JP02/01470

§ 371 (c)(1),
(2), (4) Date: Oct. 28, 2002

(87) PCT Pub. No.: WO02/069401

PCT Pub. Date: Sep. 6, 2002

(65) Prior Publication Data

US 2003/0111734 A1 Jun. 19, 2003

(30) Foreign Application Priority Data

Feb. 28, 2001 (JP) .......................... 2001-54075

(51) Int. Cl.⁷ .................. H01L 23/495; H01L 23/48
(52) U.S. Cl. .................. 257/673; 257/693; 257/737; 257/738; 257/780; 257/781; 257/782; 257/784
(58) Field of Search ............... 257/673, 693, 257/737, 738, 780–782, 784, 723

(56) References Cited

U.S. PATENT DOCUMENTS 6,127,735 A * 10/2000 Berger et al. ............... 257/778
6,285,559 B1 * 9/2001 Fukiharu .................... 361/760
6,365,973 B1 * 4/2002 Koning ....................... 257/772
6,403,402 B1 * 6/2002 Ohsawa et al. .............. 438/123
6,433,409 B2 * 8/2002 Mita et al. .................. 257/772
6,544,814 B1 * 4/2003 Yasunaga et al. ........... 438/108
2002/0173069 A1 * 11/2002 Shibata ....................... 438/106

FOREIGN PATENT DOCUMENTS

| JP | 8-306739 | 11/1996 |
|---|---|---|
| JP | 11-74310 | 3/1999 |
| JP | 11-135672 | 5/1999 |
| JP | 11-163022 | 6/1999 |
| JP | 11-345834 | 12/1999 |
| JP | 2000-22040 | 1/2000 |
| JP | 2000-36518 | 2/2000 |
| JP | 2000-124256 | 4/2000 |

\* cited by examiner

*Primary Examiner*—Jasmine Clark
(74) *Attorney, Agent, or Firm*—Rader, Fishman & Grauer PLLC; Ronald P. Kananen

(57) ABSTRACT

To make it possible to mount micro ball electrodes of a semiconductor device of CSP (chip size package) or BGA (ball grid array) type, to reduce the diameter of the electrode forming hole, to make fine the pattern of the wiring film, to improve precision of the external accuracy, and to facilitate production. A plurality of wiring films (4) are formed on one surface part of the base (5) of an insulating resin such that said film surface is positioned flush with said base surface and at least part of the wiring films overlap the electrode forming hole (8) of said base, each electrode forming hole (8) is buried with an electrically conductive material and the external electrode (6) projecting to the opposite side of the wiring film is formed, and the semiconductor chip (14) is flip-chip-connected onto said one surface of the base (5).

56 Claims, 12 Drawing Sheets

SEMICONDUCTOR DEVICE, PROCESS FOR PRODUCTION THEREOF, AND ELECTRONIC EQUIPMENT

TECHNICAL FIELD

The present invention relates to a semiconductor device, a process for production thereof, and electronic equipment.

BACKGROUND ART

CSP (chip size package) to cope with increase in the number of electrodes in recent semiconductor chips has been usually accomplished by pellet-bonding the semiconductor chip and wire-bonding the semiconductor chip to the wiring of the wiring substrate side. FIG. 14 is a sectional view showing an example of the semiconductor device of wiring bonding type. In this figure, a is a polyimide resin base, b is a wiring film, c is an electrode forming hole, d is a micro ball electrode of solder formed in said electrode forming hole c, 1 is, for example, a silver paste film, f is a semiconductor chip which is bonded to the surface of the base a through the silver paste film 1, i is a resin reinforcement and a ring to dam up resin, m is a wire to electrically connect the electrode of the semiconductor chip f and the wiring film b, and n is a sealing resin supplied by potting.

However, CSP (chip size package) of the type in which the semiconductor chip is flip-chip-connected has recently appeared.

FIG. 15 is a sectional view showing one of conventional examples of CSP of flip chip connection type which employs FPC (flexible printed circuit board). In this figure, a is a polyimide resin base, b is a wiring film of copper formed on the surface of said base a, c is an electrode forming hole formed in said base a, d is a micro ball electrode of solder formed in said electrode forming hole c, e is an anisotropic conducting film, i is a film-reinforcing ring of, for example, copper or nickel, j is an adhesive to bond the film-reinforcing ring i to the base a, and k is a plating film of gold that coats the surface of said wiring film b. The anisotropic conducting film e bonds the semiconductor chip f to the base a surface and it also connects the external lead electrode of said semiconductor chip f to the wiring film b through the metal bump g on said electrode surface.

By the way, since CSP of the type shown in FIG. 14 is constructed such that the semiconductor chip f is mounted on the base a with its electrodes upward and the electrodes are connected to the wiring film b by means of the wire m, the bent part of the wire m is above the top of the semiconductor chip f and there was the problem that it is difficult to reduce the thickness of the sealing resin and in turn to reduce the thickness of the package.

By contrast, CSP of the type shown in FIG. 15, which does not use the wire m, has no such a problem. However, there is an increasing demand for high integration and miniaturization of semiconductor devices, and there was a problem that it is difficult to meet the requirement for further smaller and thinner packages. One reason for this is that the package of the type shown in FIG. 15 has the wiring film b which is formed on the surface of the resin base a. In other words, the wiring film b makes the resulting package thicker by its thickness, and hence it is difficult to meet the requirement for further thickness reduction.

Moreover, since the wiring film is formed convex on the film surface, the resin hardly enters the gap between the wiring film and the wiring film, and voids are liable to occur. These voids absorb moisture and absorbed moisture explodes at the time of reflowing, thereby peeling the connection between the wiring film on the film and the bump.

The present invention was completed in order to solve such problems. It is intended to facilitate the production of a semiconductor device of CSP or BGA type, in which the chip is mounted in flip chip type, to reduce cost, to reduce the package thickness, and to improve reliability.

DISCLOSURE OF INVENTION

The semiconductor device of the first claim is characterized in that it includes a wiring substrate and a semiconductor chip, said wiring substrate having a wiring film and an insulating resin formed thereon such that the former is embedded in one surface of the latter, with one surface of the former being flush with said one surface of the latter, said wiring substrate further having a hole at the position where at least part of said wiring film overlaps with said insulating resin, said semiconductor chip having at least part of its external lead electrodes connected to said wiring film on said wiring substrate through bumps.

Therefore, according to the semiconductor device of the first claim, since the wiring film is embedded in one surface of the base, it is possible to eliminate steps on the surface, and further since the semiconductor chip is mounted by flip chip on such base surface, it is possible to reduce the thickness of the semiconductor device.

And, since it is possible to form the electrode forming hole by exposure and development, it is possible to contrive miniaturization and higher integration density, and in turn it is possible to increase integration of the semiconductor device and to increase the number of electrodes.

The production process of the semiconductor device of the thirteenth claim is characterized in that it includes the steps of providing a wiring substrate which is so formed as to permit a plurality of semiconductor chips to be mounted thereon and a plurality of semiconductor chips each having bumps formed on the external lead electrode, connecting the gap between said bump of said each semiconductor chip and the wiring film of said wiring substrate by ultrasonic wave or heating under pressure, casting a resin into the vicinity of said bumps, thereby sealing it, and finally separating said wiring substrate to give a plurality of semiconductor devices.

Therefore, according to the production process of the semiconductor device of the thirteenth claim, the semiconductor chip is flip-chip-connected to the wiring substrate by ultrasonic wave or by heating under pressure and sealed with a resin, and subsequently it is divided; therefore, it is possible to obtain simultaneously a plurality of semiconductor devices which have been made thin.

The production process of the semiconductor device of the fourteenth claim is characterized in that it includes the steps of providing a wiring substrate and a plurality of semiconductor chips mounted thereon, each having bumps formed on the external lead electrode, pasting an anisotropic conducting film to the wiring film forming plane of said wiring substrate, placing the semiconductor chip on said anisotropic conducting film on said wiring substrate, electrically connecting the gap between the bump of said semiconductor chip and said wiring film by heating under pressure, and casting a resin into the vicinity of said semiconductor chip for its sealing.

Therefore, according to the production process of the semiconductor device of the fourteenth claim, the semiconductor chip is flip-chip-connected to the wiring substrate by using the anisotropic conducting film, and sealing with a resin, thereby it is possible to obtain the semiconductor device which has been made thin. Also, since the substrate is flat, voids hardly occur and it hardly suffers breakage due to moisture absorption at the time of reflowing.

The semiconductor device of the fifteenth claim is characterized in that a plurality of wiring films are placed on one side of an insulating resin base such that the surface of said wiring film is approximately flush with the surface of said base and at least part of said wiring film is so formed as to overlap with the electrode forming hole in said base, said electrode forming holes are filled with a conducting material, external electrodes projecting toward the opposite side of the wiring film are formed, and the semiconductor chip is flip-chip-bonded to said one surface of said base.

Therefore, according to the semiconductor device of the fifteenth claim, since the wiring film is embedded in one surface part of the base, it is possible to eliminate surface steps; since the semiconductor chip is mounted on such a surface, the mounting of the semiconductor chip becomes easy, and it is possible to increase the reliability of the semiconductor device. And, since the electrode forming hole can be formed by exposure and development, it is possible to contrive miniaturization and increased integration, and in turn it is possible to contrive higher integration of the semiconductor device and increase in the number of electrodes.

And, in the case where a metal ring is bonded outside the flip chip connection part on the base on which the wiring film is formed, the ring functions as a gland source and also as an electrostatic shield to shield the semiconductor chip electrostatically from outside. The ring also functions as a dam to prevent the sealing resin from leaking outside at the time of resin sealing.

The semiconductor device of the sixteenth claim is characterized in that a plurality of wiring films are placed on one side of a base having electrode forming holes such that the surface of said wiring film is approximately flush with the surface of said base and at least part of said wiring film is so formed as to overlap with the electrode forming holes, said electrode forming holes are filled with a conducting material, external electrodes projecting toward the opposite side of the wiring film are formed, a semiconductor chip is bonded with its reverse side to said one side of said base by means of the insulating film, and each electrode of said semiconductor chip is flip-chip-connected to its corresponding wiring film.

Therefore, according to the semiconductor device of the sixteenth claim, the wiring film is embedded in one side of the base and hence it is possible to eliminate surface steps; since the semiconductor chip is mounted on such a surface, flip chip connection of the semiconductor chip becomes easy, and it is possible to increase the reliability of the semiconductor device. And, since the electrode forming hole can be formed by exposure and development, it is possible to contrive miniaturization and higher density of integration, and in turn it is possible to contrive higher integration of the semiconductor device and increase in the number of electrodes.

The production process of the semiconductor device of the twenty-first claim is characterized in that it includes the steps of selectively forming a masking film on one side of a metal substrate, forming a wiring film by plating through said masking film, forming an etch-stopping metal film as an underlayer, forming an insulating resin base having electrode forming holes on the surface adjacent to the wiring film of said metal substrate, and performing etching on the reverse side of the region in which at least the wiring film is formed on said metal substrate such that at least the etch stopping metal film constituting said underlayer is exposed.

Consequently, according to the production process of the semiconductor device of the twenty-first claim, it is possible to form a wiring film by plating which employs the metal substrate as a masking film and subsequently form the electrode forming holes of insulating resin and form the external electrodes by plating; therefore, it is possible to easily form the wiring film and external electrodes by electroplating. The reason for this is that since the metal substrate and each wiring film are in the electrically connected state, it is possible to impart a potential necessary for electroplating to the entire surface of the metal substrate. And, since it is possible to obtain by electroplating a plating film with better film quality than that obtained by electroless plating, it is possible to easily obtain a good wiring film and external electrode. And, therefore, it is possible to reduce the size of the wiring film and external electrode and increase the density of wiring density. And, coupled with the size reduction of the wiring film, it is possible to increase the number of wiring film that can be passed between the external electrodes, and in turn it is possible to increase the number of arrangement tiers of the external electrode. This makes it possible to increase the number of external electrodes.

Also, since it is possible to form the electrode forming hole by patterning of the insulating resin on the metal substrate, it is possible to reduce the size of the electrode forming hole. It became possible to reduce the diameter of the electrode forming hole to 0.22 mm or below, which conventionally could not be reduced below 0.5 mm for FPC type or below 0.35 mm for rigid substrate type. And, coupled with the reduction in size of the electrode forming hole, it is possible to increase the density of arrangement of the electrode forming holes. Since it is possible to form the electrode forming hole by patterning the insulating resin, working is not troublesome but is highly productive unlike the conventional practice in which the electrode forming hole is made by drilling as in the case of rigid substrate.

And, the etching is performed on the region in which at least the wiring film is formed on the metal substrate until the etch stopping metal film constituting at least said underlayer is exposed from the reverse side. This etching is performed such that the outer metal substrate remained in the form of a ring. In this way it is possible to use the remaining part as a ring. And, it is possible to use the ring as the gland source terminal and electrostatic shield as mentioned above. Since this ring forms the external shape of the semiconductor device and it is formed by etching, it is possible to improve working precision. Therefore, it is possible to improve the external shape precision of the semiconductor device.

Moreover, since production is carried out by using the metal substrate as a base metal, there is no possibility of deformation such as bending during production. Therefore, it is easy to carry out working even though the semiconductor device becomes large. Consequently, it is possible to easily increase the size of the semiconductor device.

The electronic equipment of the twenty-third claim is characterized in that it contains at least one of the semiconductor devices defined in the first to twelfth claims and the fifteenth to twentyth claims.

Therefore, according to the electronic equipment of the twenty-third claim, since the semiconductor devices having the above-mentioned advantages are used, it is possible to enjoy their advantages.

BEST MODE FOR CARRYING OUT THE INVENTION

Figure 1A:
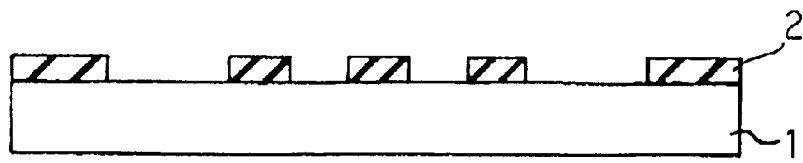
FIGS. 1A to 1E are sectional views sequentially showing steps (A) to (E) of the first and second examples of the production process of the semiconductor device according to the present invention.

An embodiment for the semiconductor device according to the present invention is designed to obtain a package by forming a plurality of wiring films on one surface of a base of insulating resin such that the surface of said film is approximately flush with the surface of said base and at least part of the wiring film overlaps with said electrode forming hole, filling said electrode forming hole with a conducting material and forming an external electrode on the opposite side of the wiring film, forming bumps on the external electrodes of the semiconductor chip, electrically connecting the wiring film on the base to the bumps by heating under pressure, by pressing with ultrasonic wave vibration, or by heating under pressure with ultrasonic wave vibration, casting a resin into the space between the base and the semiconductor chip, curing by heating, and separating.

Also, another embodiment for the semiconductor device according to the present invention is designed to obtain a package by forming a plurality of wiring films on one surface of a base such that the surface of said film is approximately flush with the surface of said base and at least part of the wiring film overlaps with said electrode forming hole, filling said electrode forming hole with a conducting material and forming an external electrode on the opposite side of the wiring film, forming bumps on the external lead electrodes of the semiconductor chip, electrically connecting the wiring film on the base to the bumps through conducting particles, casting a resin just above the external lead electrodes of the package, curing by heating, and separating.

And, the semiconductor device in which a semiconductor chip is mounted on such a package can be formed by the process consisting of the steps of selectively forming a mask film on one surface of the metal substrate and performing plating through said masking film to form the etch stopping metal film for the wiring film as the underlayer, forming a base of insulating resin having the electrode forming hole on the surface of said metal substrate adjacent to the wiring film, and performing etching from the reverse side the region in which the wiring film of said metal substrate is formed until the etch stopping metal film is exposed.

Said metal substrate is one which becomes the base metal in production, and there is an instance in which it becomes the outer ring afterward, one of the important things is that it becomes the base metal when it is formed by plating the wiring film and external electrode, furthermore, it can become the passage for plating current, it should preferably be, for example, copper or copper-based material with high conductivity. They have extremely high stiffness and the advantage of good workability without bending despite their thinness. In the case where copper or copper-based material is used, a thickness of, say, 30 to 150 $\mu$m is preferable.

Also, it is possible to use an acrylic-based resist of photosensitive peeling type as a masking film to be used for plating to form the wiring film; in this case, the masking film is formed by patterning by exposure and development and the wiring film is formed by using it as a mask as a matter of course. After the plating treatment, the masking film is peeled. It is permissible to use an epoxy-acrylic-based photosensitive permanent resist film (with a thickness of, say, 40 $\mu$m). In this case, too, patterning is performed by exposure and development and then the wiring film is formed by plating by using it as a mask as a matter of course; however, the resist is not removed after that but is allowed to exist permanently. In this case, it is possible that the surface of the wiring film is substantially complete flush with the surface of the base; that is, it is possible to smoothen the surface. This offers the advantage that there are no steps on the underlayer when the nickel layer is formed later and hence deformation due to steps hardly occurs. Of course, materials are not limited to those mentioned above; any material not limited in the foregoing can be used so long as it becomes a mask when the wiring film is formed from metal such as copper.

As the base, it is possible to use, for example, one which is composed of polyimide film of polyamic acid type and a film with a photosensitive layer laminated thereon (thickness, say, 12 to 25 μm). And, its patterning can be accomplished by exposing and developing the photosensitive layer first and then etching the polyimide film of polyamic acid type with an etching solution such as alkali solution. At this time, the polyimide film of polyamic acid type sufficiently cures by heat treatment at about 280° C. for about 30 minutes. The thickness of the resist film as the mask is about 25 μm, for instance. Of course, it is also possible to form the masking film entirely from a photosensitive resin and form the electrode forming hole by patterning of its exposure and development. Of course, this is merely an example and there can be various variations.

The wiring film should preferably be formed by plating with copper, for instance. In this case, it is desirable to form the underlayer from nickel. The reason for this is that although the wiring film can be formed by plating on a metal substrate of, for example, copper, a copper wiring film with compact film quality does not grow readily even though plating is carried out directly on copper, and in the case where the wiring film is exposed by etching the metal substrate, an etching stopper to protect the copper wiring film from etching is necessary and nickel is most suitable for this. The thickness of said nickel film may be acceptable if it is about 2 μm. The copper constituting the wiring film should preferably be about 10 to 25 μm thick, but it can vary depending on the specification and performance of the semiconductor device, as a matter of course.

After the base having the electrode forming hole has been formed, the external electrode is formed; the external electrode can be formed from, for example, nickel by plating, for example, about 1 to 150 μm. Incidentally, it is also possible to form by performing nickel plating, for example, about 100 μm, subsequently, plating solder, for example, about 100 μm and then performing reflowing for shape adjustment. Like this, there can be various variations in the forming of the external electrode.

Said metal substrate is etched from its reverse side; this etching is essential for said wiring film to be exposed; it may be carried out entirely or selectively. In the case of selective etching, it is recommended that etching be performed on the region in which the wiring film has been formed such that the metal substrate remains as an outer ring. The reason for this is that the outer ring can be used as the reinforcing means, the gland electrode of power source, and the electrostatic shielding means, and additionally as the dam to prevent the resin from flowing at the time of resin sealing (in the case of CSP); therefore, it can be said that selective etching is better than overall etching. Such etching can be accomplished with, for example, alkali etchant (ammonia-based). The reason for this is that this etchant etches copper but does not etch nickel and hence said nickel can function as the etching stopper. Of course, this merely illustrates the embodiment.

In the case where the external electrode is formed from, for example, nickel and solder is not formed, it is desirable from the standpoint of connection to plate the surface of the nickel plating film with gold. Incidentally, it is desirable that there originally exists an underlayer of nickel for gold plating; in this case, the external electrode itself is originally nickel and the etch stopping metal film is also nickel, and hence there is no need to form a nickel underlayer purposely for gold plating; it can be said that good plating is possible. Of course, an embodiment in which the external electrode is formed from nickel and solder plating film can also be practiced in the present invention, and any other embodiment than that can also be adopted.

The present invention is applicable to the semiconductor device of CSP type as well as the semiconductor device of BGA type.

The semiconductor device of the present invention can be used for various electronic equipment, and when used particularly for electronic equipment such as portable telephones which strongly demand miniaturization, it contributes to their miniaturization and improved reliability.

EXAMPLES

In the following, the present invention will be described in more detail with reference to the illustrated embodiments. FIGS. 1A to 1E are sectional views sequentially showing steps (A) to (E) of the first example of the production process of the semiconductor device according to the present invention. FIGS. 2F to 2I are sectional views sequentially showing steps (F) to (I) of the same as above. This example is one of the examples in which the present invention was applied to the semiconductor device of CSP type.

(A) First, as shown in FIG. 1A, a metal substrate 1 of copper or copper alloy with a thickness of, for example, 50 to 250 μm is made ready, and a resist film 2 (mask film with a thickness of, for example, 30 to 60 μm) is selectively formed. As mentioned above, this resist film 2 is that of, for example, acrylic-based photosensitive peelable type or that of, for example, epoxy-acrylic-based photosensitive permanent type, and it is patterned by exposure and development.

Figure 1B:
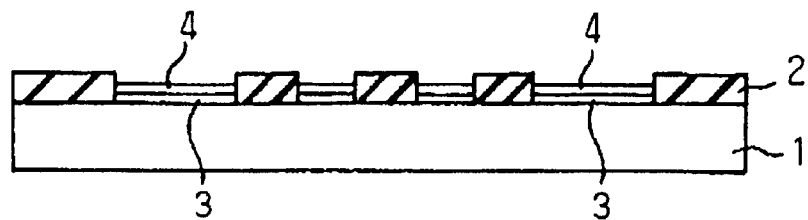

(B) Then, as shown in FIG. 1B, a nickel/gold/nickel film 3 (each layer about 0.1 to 5 μm thick) and a wiring film 4 of copper (about 1 to 30 μm thick) are formed on the surface of the metal substrate 1 by using the aforesaid resist film 2 as a mask. The reason why the wiring film 4 of copper is formed on the nickel/gold/nickel film 3 as an underlayer is that the nickel film 3 prevents the wiring film 4 of copper from being etched when the reverse side of the metal substrate 1 undergoes etching later so that the wiring is exposed. In other words, the nickel film 3 functions as an etch stopping metal film. Incidentally, the metal substrate may be replaced by the one which has a nickel film 3 formed over the entire surface thereof. After having functioned as an etch stopping metal film, this nickel film 3 is entirely etched off afterward so as to avoid short-circuits between the wiring films 4. This procedure is adopted in the second example mentioned later; however, it can also be adopted in this example.

Figure 1C:
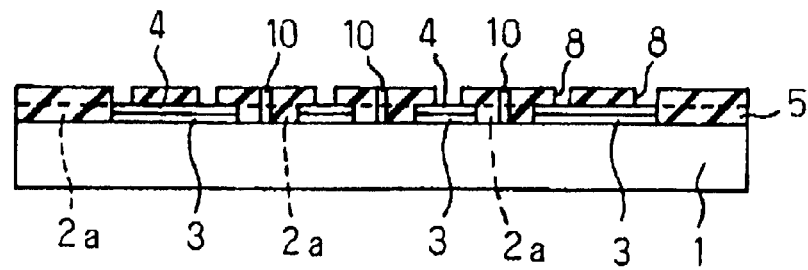

(C) Then, the aforesaid resist film 2 is removed if it is, for example, an acrylic-based one of photosensitive peelable type. Alternatively, it is left unremoved if it is, for example, an epoxy-acrylic-based one of photosensitive permanent type. And, a base 5 of, for example, polyimide resin (with a thickness of, for example, 25 μm) is formed, and it is patterned such that it has electrode forming holes 8 at prescribed positions and gas vent holes 10 smaller in diameter than them. FIG. 1C shows the state after patterning. The gas vent hole 10 permits gas to escape from the lower part of the base 5, thereby preventing the base 5 from being peeled off due to swelling by heat treatment.

Incidentally, to be concrete, the base 5 can be formed from a laminate composed of, for example, a polyimide film of polyamic acid type and a film having a photosensitive layer. And the patterning can be accomplished by first exposing and developing the photosensitive layer and then etching the polyimide film of polyamic acid type with an etching solution such as alkali solution. At this time, the polyimide film of polyamic acid type cures sufficiently upon heat treatment at about 280° C. for about 30 minutes. Of course, it is also possible to form the masking film entirely from a photosensitive resin and pattern it by exposure and development, thereby forming the electrode forming hole. Of course, it is a mere example and there can be various variations.

Figure 3A:
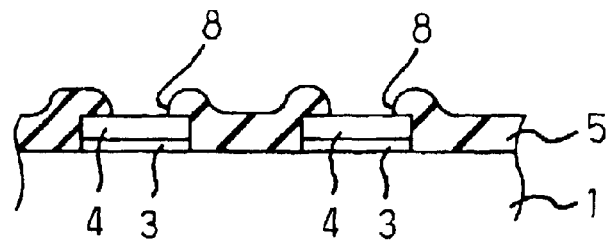
FIGS. 3A and 3B are enlarged sectional views showing for comparison the case [shown in FIG. 3A] in which the resist film is that of peelable type and the case [shown in FIG. 3B] in which the resist film is that of permanent type in the above-mentioned examples.
Figure 3B:
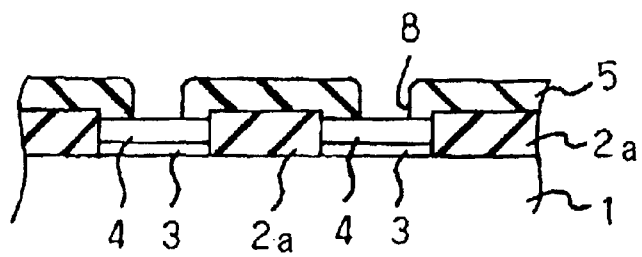

FIGS. 3A and 3B are enlarged sectional views showing for comparison the state after the base 5 has been formed in the case [shown in FIG. 3A] in which the resist film 2 is that of peelable type and in the case [shown in FIG. 3B] in which the resist film 2 is that of permanent type. And, 2a denotes the residual part of the resist film 2 of permanent type. In the case where the resist of permanent type is used, it is possible to make the surface of the wiring film approximately flush with the surface of the base. In other words, it is possible to smoothen the surface. This offers the advantage that since there are no steps on the underlayer when electrodes are formed from nickel, deformation due to steps hardly occurs in the external electrode 6.

Figure 1D:
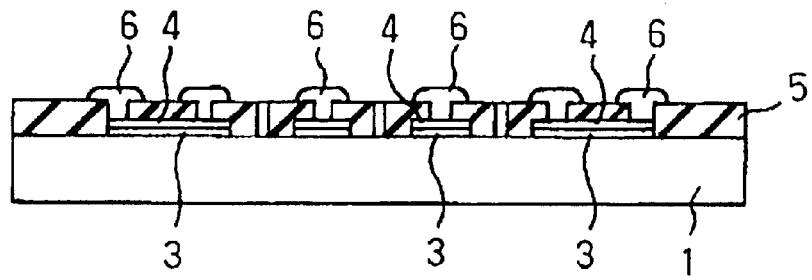
Figure 1E:
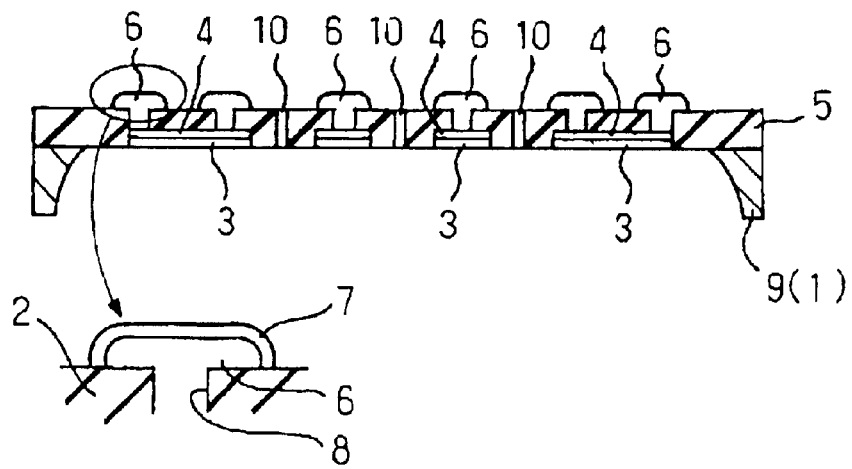

(D) Then, as shown in FIG. 1D, electroplating is performed to grow nickel film 3 into a nearly spherical electrode in each of the electrode forming hole 8. The thickness of plating is, for example, about 1 to 150 μm. After that, a gold film is formed by plating.

(E) Then, the reverse side of the metal substrate 1 undergoes selective etching so that the outer ring 9 is left unetched on individual semiconductor devices, thereby the outer ring 9 is formed and the wiring film 4 is exposed through the nickel film 3. This etching is carried out by using an alkali etchant (ammonia type). At this time, the nickel film 3 prevents the wiring film 4 of copper being etched. After that, the nickel film is etched so that the gold film is exposed. Incidentally, although the gold film 7 is not shown in FIG. 1E (the main part) and FIGS. 2F to 2I for the sake of convenience, the gold film 7 is shown in the lower part of FIG. 1E which is an enlarged view of the external electrode 6.

Figure 2F:
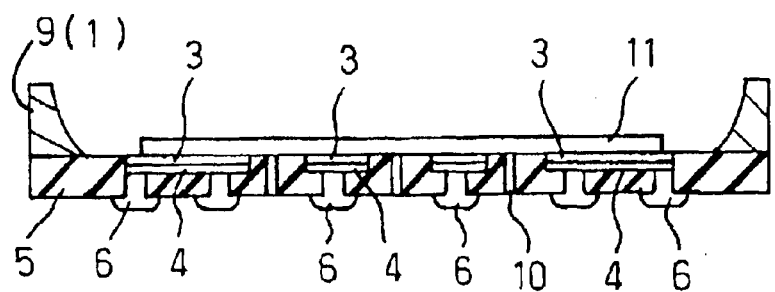
FIGS. 2F to 2I are sectional views sequentially showing steps (F) to (I) of the first and second examples of the production process of the semiconductor device according to the present invention.

(F) Then, as shown in FIG. 2F, an anisotropic conducting film (with a thickness of, for example, 50 μm), which is an adhesive tape containing conductive particles dispersed therein, is bonded to that side of the base 5 on which the wiring film has been formed.

Figure 2G:
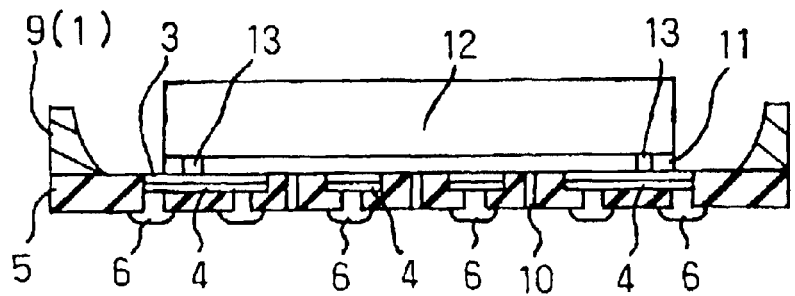

(G) Then, the semiconductor chip 12 is connected by flip chip bonding. To be concrete, stud bumps 13 are formed by plating or wire bonding on the external lead electrodes of the semiconductor chip 12, flip chip bonding is performed such that the bump 13 of the semiconductor chip 12 coincide with the wiring film 4 of the aforesaid base 5, and subsequently the semiconductor chip 12 is heated under pressure so that the anisotropic conducting film cures and the external lead electrode of the semiconductor chip 12 is electrically connected to the wiring film 4 of the base 5. FIG. 2G shows the state after flip chip bonding.

Incidentally, the bumps 13 on the semiconductor chip can be formed by using an ordinary stud bump bonder. In this case, one good condition is as follows.
Temperature: 100 to 250° C., load: 10 to 70 gf, US duration: 5 to 50 ms, US (ultrasonic wave) power: 1 to 500 mW.
The bumps may also be formed by plating.

Also, the bumps may be formed on the side of the wiring film 4 of the base 5 rather than on the side of the semiconductor chip. The bumps on the side of the wiring film 4 can be formed by introducing a stud bump forming soft into an ordinary wire bonder.

Figure 2H:
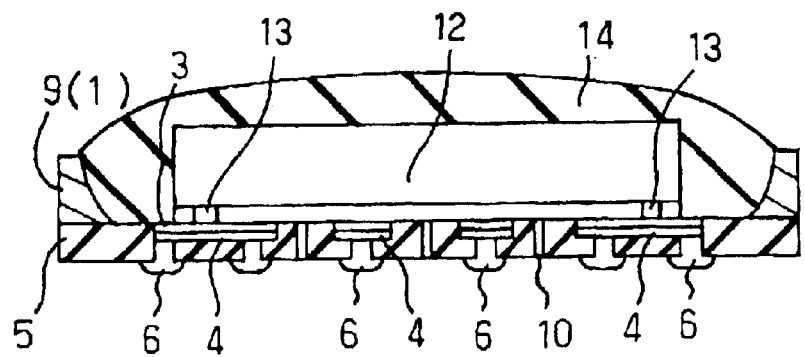

(H) Then, as shown in FIG. 2H, a resin is cast just above the external lead electrodes of the package (PKG) and then cured. 14 denotes a liquid resin. At this time, the aforesaid outer ring 9 functions as a dam to prevent the resin 14 from flowing outward.

Figure 2I:
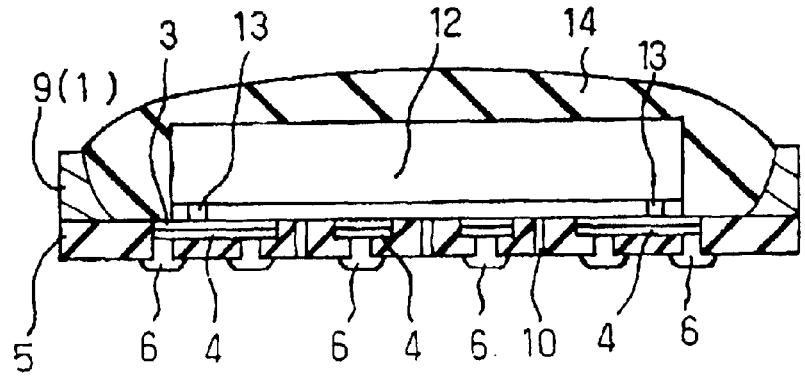
Figure 4A:
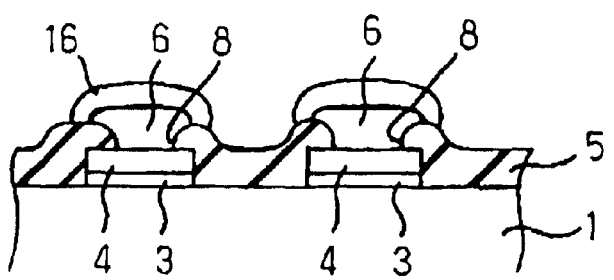
FIGS. 4A and 4B are sectional views in each step of the case in which a solder plating film is formed on a nickel film constituting the external electrode [see FIG. 4A] and subsequently it is adjusted by reflowing [see FIG. 4B].
Figure 4B:
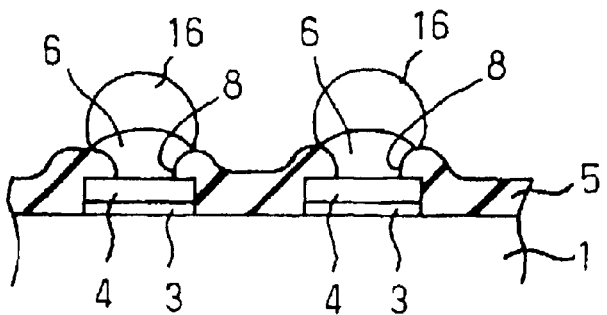

(I) Then, as shown in FIG. 2I, the external electrodes 6 of nickel are adjusted into an approximately dome shape (or ball shape) by reflowing or the like. Incidentally, this procedure may be modified as shown in FIGS. 4A and 4B such that a solder plating film 16 is formed on the nickel film 6 (with a thickness of, for example, 50 to 100 μm) constituting the external electrode 6 [see FIG. 4A] and subsequently it is adjusted by reflowing [see FIG. 4B]. In this way the semiconductor device of the present invention is completed. The semiconductor device shown in FIG. 2I is the first example of the semiconductor device of the present invention.

Next, the second example of the production process of the semiconductor device of the present invention is explained with reference to the same drawings (FIGS. 1A to 1E and FIGS. 2F to 2I) as above.

(A) First, as shown in FIG. 1A, a metal substrate 1 of copper or copper alloy with a thickness of, for example, 50 to 250 μm is made ready, and a resist film 2 (mask film with a thickness of, for example, 30 to 60 μm) is selectively formed. As mentioned above, this resist film 2 is that of, for example, acrylic-based photosensitive peelable type or that of, for example, epoxy-acrylic-based photosensitive permanent type, and it is patterned by exposure and development.

(B) Then, as shown in FIG. 1B, a nickel/gold/nickel film 3 (each layer about 0.1 to 5 μm thick) and a wiring film 4 of copper (about 1 to 30 μm thick) are formed on the surface of the metal substrate 1 by using the aforesaid resist film 2 as a mask. The reason why the wiring film 4 of copper is formed on the nickel/gold/nickel film 3 as an underlayer is that the nickel film 3 prevents the wiring film 4 of copper from being etched when the reverse side of the metal substrate 1 undergoes etching later so that the wiring is exposed. In other words, the nickel film 3 functions as an etch stopping metal film. Incidentally, the metal substrate may be replaced by the one which has a nickel film 3 formed over the entire surface thereof. After having functioned as an etch stopping metal film, this nickel film 3 is entirely etched off afterward so as to avoid short-circuits between the wiring films 4. This procedure is adopted in the third example mentioned later; however, it can also be adopted in this example.

(C) Then, the aforesaid resist film 2 is removed if it is, for example, an acrylic-based one of photosensitive peelable type. Alternatively, it is left unremoved if it is, for example, an epoxy-acrylic-based one of photosensitive permanent type. And, a base 5 of, for example, polyimide resin (with a thickness of, for example, 25 μm) is formed, and it is patterned such that it has electrode forming holes 8 at prescribed positions and gas vent holes 10 smaller in diameter than them. FIG. 1C shows the state after patterning. The gas vent hole 10 permits gas to escape from the lower part of the base 5, thereby preventing the base 5 from being peeled off due to swelling by heat treatment.

Incidentally, to be concrete, the base 5 can be formed from a laminate composed of, for example, a polyimide film of polyamic acid type and a film having a photosensitive layer. And the patterning can be accomplished by first exposing and developing the photosensitive layer and then etching the polyimide film of polyamic acid type with an etching solution such as alkali solution. At this time, the polyimide film of polyamic acid type cures sufficiently upon heat treatment at about 280° C. for about 30 minutes. Of course, it is also possible to form the masking film entirely from a photosensitive resin and pattern it by exposure and development, thereby forming the electrode forming hole. Of course, it is a mere example and there can be various variations.

FIGS. 3A and 3B are enlarged sectional views showing for comparison the state after the base 5 has been formed in the case [shown in FIG. 3A] in which the resist film 2 is that of peelable type and in the case [shown in FIG. 3B] in which the resist film 2 is that of permanent type. And, 2a denotes the residual part of the resist film 2 of permanent type. In the case where the resist of permanent type is used, it is possible to make the surface of the wiring film approximately flush with the surface of the base. In other words, it is possible to smoothen the surface. This offers the advantage that since there are no steps on the underlayer when electrodes are formed from nickel, deformation due to steps hardly occurs in the external electrode 6.

(D) Then, as shown in FIG. 1D, electroplating is performed to grow nickel film 3 into a nearly spherical electrode in each of the electrode forming hole 8. The thickness of plating is, for example, about 1 to 150 $\mu$m. After that, gold plating is performed.

(E) Then, the reverse side of the metal substrate 1 undergoes selective etching so that the outer ring 9 is left unetched on individual semiconductor devices, thereby the outer ring 9 is formed and the wiring film 4 is exposed through the nickel film 3. This etching is carried out by using an alkali etchant (ammonia type). At this time, the nickel film 3 prevents the wiring film 4 of copper being etched. After that, the nickel film is etched so that the gold film is exposed. Incidentally, although the gold film 7 is not shown in FIG. 1E (the main part) and FIGS. 2F to 2I for the sake of convenience, the gold film 7 is shown in the lower part of FIG. 1E which is an enlarged view of the external electrode 6.

(F) Then, as shown in FIG. 2F, an anisotropic conducting film (with a thickness of, for example, 50 $\mu$m), which is an adhesive tape containing conductive particles dispersed therein, is bonded to that side of the base 5 on which the wiring film has been formed.

(G) Then, the semiconductor chip 12 is connected by flip chip bonding. To be concrete, stud bumps 13 are formed by plating or wire bonding on the external lead electrodes of the semiconductor chip 12, flip chip bonding is performed such that the bump 13 of the semiconductor chip 12 coincides with the wiring film 4 of the aforesaid base 5, and subsequently the semiconductor chip 12 is heated under pressure so that the anisotropic conductive film cures and the external lead electrode of the semiconductor chip 12 is electrically connected to the wiring film 4 of the base 5. FIG. 2G shows the state after flip chip bonding.

Incidentally, the bumps 13 on the semiconductor chip can be formed by using an ordinary stud bump bonder. In this case, one good condition is as follows.

Temperature: 100 to 250° C., load: 10 to 70 gf, US duration: 5 to 50 ms, US (ultrasonic wave) power: 1 to 500 mW.

The bumps may also be formed by plating.

Also, the bumps may be formed on the side of the wiring film 4 of the base 5 rather than on the side of the semiconductor chip. The bumps on the side of the wiring film 4 can be formed by introducing a stud bump forming soft into an ordinary wire bonder.

(H) Then, as shown in FIG. 2H, a resin is cast just above the external lead electrodes of the package (PKG) and then cured. 14 denotes a liquid resin. At this time, the aforesaid outer ring 9 functions as a dam to prevent the resin 14 from flowing outward.

(I) The semiconductor device shown in FIG. 2I is the second example of the semiconductor device of the present invention.

According to the semiconductor device (regardless of the first example or the second example) as shown in FIG. 2I, the wiring film 4 is embedded in one surface of the base 5, so that it is possible to make flat the plane of the wiring film forming side of the base 5. And it is possible to form easily the wiring film 4 on the wiring film forming side of the fine pattern. And since the electrode forming hole 8 can be formed by exposure and development for the base 5, it is possible to achieve miniaturization and increase in the density of integration. In turn, it is possible to produce semiconductor devices with higher integration and more electrodes. Also, by forming the gas vent hole 10 in the base 5, it is possible to prevent the base 5 from peeling due to popcorn phenomena. Also, voids hardly occur between the film and the resin, and moisture absorption and film peeling at the time of reflow hardly occur.

And, since the metal ring (outer ring) 9 is bonded outside the flip chip connection part of the semiconductor chip 12 in the wiring film forming plane of the base 5, it is possible to use this ring 9 as, for example, the gland source, further as the electrostatic shield to selectrostatically shield the semiconductor chip 12 from the outside; in addition, it is possible to use it as the dam to prevent the sealing resin from flowing outside at the time of resin sealing, and it is possible to reduce the fraction defective of the defective resin sealing.

And, the production process of the semiconductor device shown in FIGS. 1A to 1E and FIGS. 2F to 2I (regardless of the first example or the second example) consists of selectively forming the resist film (mask film) on one surface of the metal substrate 1, forming the underlayer of nickel film 3 (as an etch stopping metal film) and forming thereon the wiring film 4 by plating, forming the base 5 of insulating resin having the electrode forming hole 8 and the gas vent hole 10 on the surface of the wiring film side of said metal substrate 1, performing etching on, at least, the reverse side of the region of said metal substrate 1 in which the wiring film 4 has been formed until the nickel film (etch stopping metal film) 3 as the underlayer is exposed, mounting the semiconductor chip 12 on the part where gold film has been exposed by nickel etching or gold plating or the part where surface gold film has been formed, and casting the resin 14 just above the external lead electrodes of PKG and curing it.

According to the production process like this, it is possible to use the metal substrate 1 as the base metal of production and to form the wiring film 4 by plating using the resist film 2 as the mask, subsequently it is possible to form the electrode forming hole 8 in the base 5 and then form the external electrode 6 by plating, and hence it is possible to easily form the wiring film 4 and the external electrode 6 by electroplating. The reason for this is that since the metal substrate 1 and each wiring film 4 are in the electrically connected state, it is possible to impart a potential necessary for electroplating to the metal substrate 1. And, according to electroplating, it is possible to obtain a plating film with better film quality than that obtained by electroless plating, and hence it is possible to obtain easily the good wiring film 4 and the external electrode 6. Also, therefore, it is possible to miniaturize the wiring film 4 and the external electrode 6 and to increase the density of configuration. And, coupled with miniaturization of the wiring film, it is possible to increase the number of wiring films between the external electrodes; this in turn makes it possible to increase the number of tiers for the external electrodes. This makes it possible to increase the number of external electrodes.

Moreover, the sheet increases in strength owing to the partly left metal substrate and becomes less liable to deformation, and hence it is possible to carry out simply and rapidly the work at the time of PKG manufacture.

Also, since the strength of the sheet increases, it is possible to make thin the thickness of the base to 5 μm; it becomes possible to produce a thinner PKG by using this sheet.

Figure 5A:
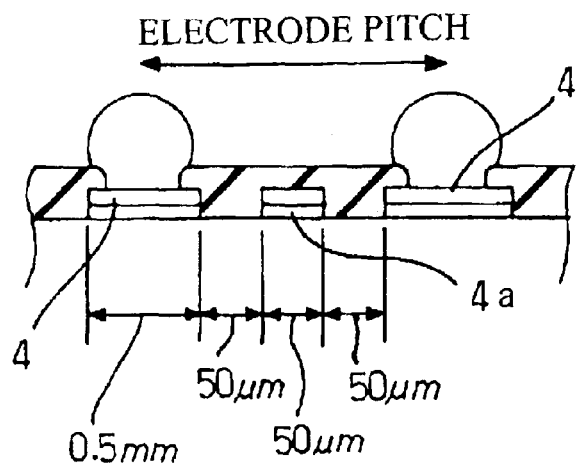
FIGS. 5A and 5B are sectional views for comparison showing the conventional case [shown in FIG. 5A] and the case of the above-mentioned examples [shown in FIG. 5B].
Figure 5B:
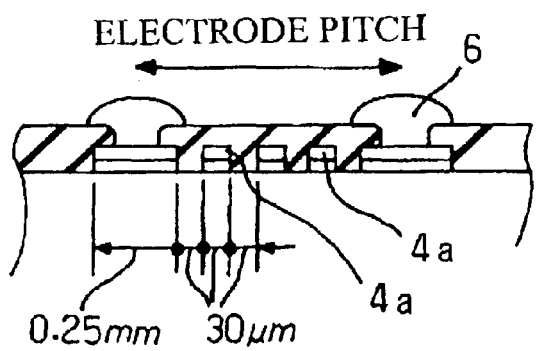
Figure 5C:
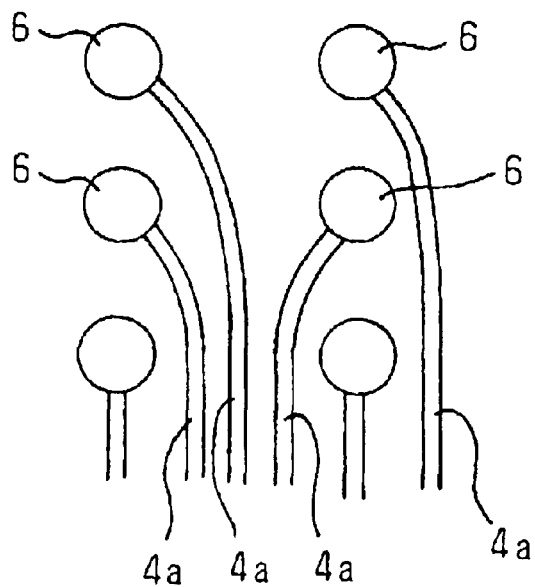
FIG. 5C is a plan view showing the pattern of the wiring film in said example.

FIGS. 5A and 5B are sectional views showing the conventional case [shown in FIG. 5A] and the case of this example [shown in FIG. 5B] for comparison of the arrangement pitch of the external electrode 6. FIG. 5C is a plan view demonstrating that it is possible to increase the number of wiring films between the external electrodes in the case of this example. In the conventional case (FPC type) with difficulties in fine patterning, the width of the part in which the external electrode of the wiring film is formed is 500 μm, the width of the wiring film between the external electrodes is 50 μm, the interval between the wiring films is 50 μm, in the case where the external electrode arrangement pitch is to be reduced, it is impossible to increase the number of the wiring films that can be placed between the external electrodes. In contrast, since this example permits fine patterning, it is possible to increase the number of the wiring films 4a that can be placed between the external electrodes even though the external electrode arrangement pitch is reduced compared to that of the conventional case as shown in FIG. 5C, and the multi-tier ball arrangement is possible. This greatly helps semiconductor devices to have more electrodes and higher integration. 4a shows the wiring film placed between the external electrodes 6.

Also, since it is possible to form the electrode forming hole 8 by patterning the base 5 on the metal substrate 1, miniaturization of the electrode forming hole 8 is possible; it became possible to reduce the diameter of the electrode forming hole 8 below 0.22 mm or less which could not be reduced below 0.5 mm for FPC type or below 0.35 mm for the rigid substrate type in the conventional case. And, coupled with such miniaturization of the electrode forming hole 8, it is possible to increase the density of arrangement of the electrode forming holes 8. Also, it is possible to form the electrode forming hole 8 by patterning the insulating resin, working is less troublesome and more productive compared with the case in which the electrode forming hole is made by drilling as in the rigid substrate type.

And, by performing etching on the region of the metal substrate in which at least the wiring film 4 is formed until at least the nickel film (etch stopping metal film) 3 as the underlayer is exposed from the reverse side in such a way that the metal substrate remains outside in ring form, it is possible to use the remaining part as the ring 9. And, it is possible to use the ring 9 as the gland source terminal and electrostatic shield; since the ring forms the exterior of the semiconductor device and it is formed by etching, it helps increase the working precision. Therefore, it is possible to increase the precision of the exterior of the semiconductor device.

Moreover, since production is carried out by using the metal substrate 1 as a base metal, there is no possibility of deformation such as bending during production. Therefore, it is easy to carry out working. Incidentally, as the occasion may be, the outer ring 9 may be cut off afterwards, thereby reducing the size of the semiconductor device. Since the outer ring 9 produces the reinforcing effect but the resin 14 itself produces the reinforcing effect after resin sealing, it is not necessarily essential and it may be cut off in some case. In such a case, the outer ring 9 may be cut off so as to reduce the size of the semiconductor device.

FIGS. 6A to 6F and FIGS. 7G to 7I are sectional views sequentially showing steps (A) to (I) of the third example of the process for production of semiconductor device according to the present invention. This example is one example to which the present invention was applied to the semiconductor device of BGA (ball grid array) type.

Figure 6A:
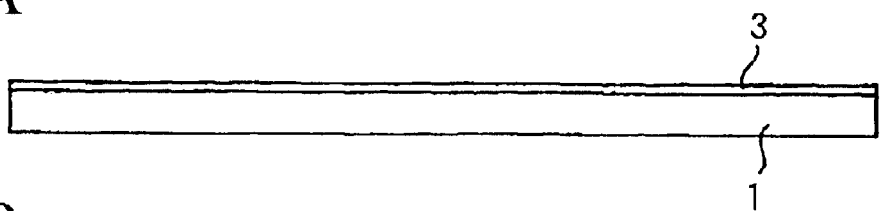
FIGS. 6A to 6F are sectional views sequentially showing steps (A) to (F) of the third example of the production process of the semiconductor device according to the present invention.

(A) First, as shown in FIG. 6A, a metal substrate is made ready which is composed of a thin sheet of copper or copper alloy with a thickness of, for example, 150 μm and a nickel film 3 (with a thickness of, for example, 2 μm) laminated thereon which becomes an etch stopping metal film.

Figure 6B:
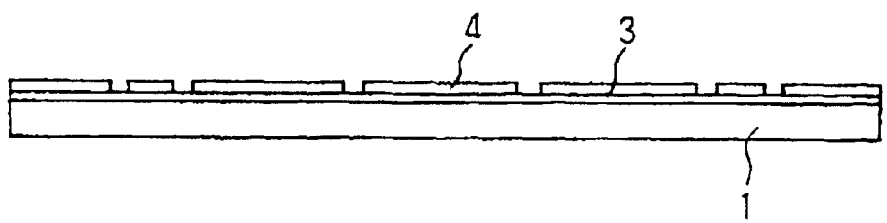

(B) Next, as shown in FIG. 6B, wiring films 4 (with a thickness of, for example, 25 μm) of copper are selectively formed. This selective forming method is accomplished by selectively forming a resist film (as a mask) on the surface of the nickel film 3 (as an underlayer), and plating the wiring film 4 of copper. There is nothing different essentially from the first and second examples in this respect. The selective formation of the wiring film is possible in the same way as in the first and second examples. However, in the first and second examples, the metal substrate was one which is composed solely of copper or copper alloy and has no nickel film on the surface thereof, and hence the method was employed in which nickel film 3 constituting the etch stopping metal film is formed by plating with the resist film as a mask and subsequently the wiring film 4 of copper is formed by plating; in the third example, since the nickel film 3 has already been formed on the surface of the metal substrate, it is not necessary to form the nickel film 3 by plating.

Figure 6C:
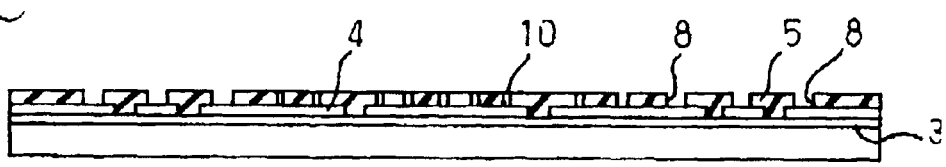

(C) Next, as shown in FIG. 6C, the base 5 of, for example, polyimide is selectively formed. The selective forming method may be the same method as in the first example. 8 is an electrode forming hole and 10 is a gas vent hole with a considerably smaller diameter than the electrode forming hole 8.

Figure 6D:
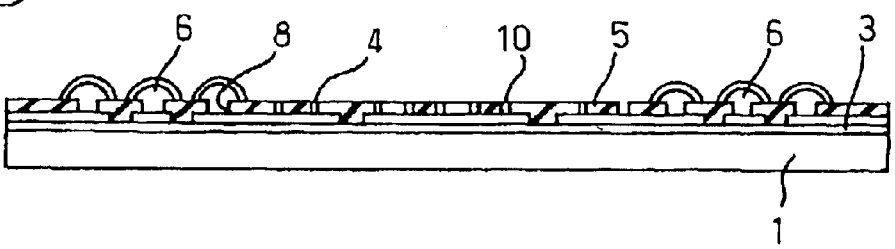

(D) Next, as shown in FIG. 6D, the nickel film 3 is grown in the electrode forming hole 8 by plating, further it is made to project from the electrode forming hole 8, and further, for example, a solder film 16 (with a thickness of, for example, about 100 μm) is formed on the surface of the nickel film 6 (with a thickness of, for example, 40 to 150 μm).

Figure 6E:
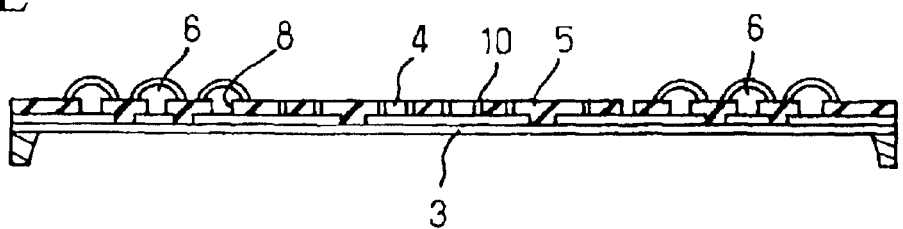

(E) Next, as shown in FIG. 6E, the surface of the nickel film 3 is exposed by selectively etching the part of the metal substrate 1 which is made of copper (see FIGS. 4A and 4B). This selective etching is carried out such that (the part made of copper or copper alloy) of the metal substrate 1 is left in a ring form at its peripheral part and it forms the outer ring 9. It is needless to say that in this etching the nickel film 3 plays a role of preventing the wiring film of copper 4 from being etched, or it plays a role as the etch stopping metal film.

Figure 6F:
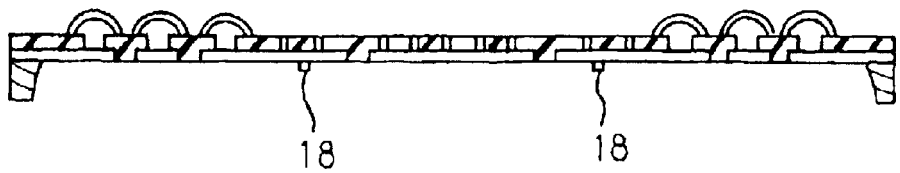

(F) Next, as shown in FIG. 6F, the nickel film 3 as the etch stopping metal film which was formed entirely on the surface part of the metal substrate 1 is removed by etching. This nickel film 3 is removed by etching because it was formed entirely and it shorts the wiring films 4 made of copper if it is left as it is. Incidentally, in the case of the first example, since the nickel film 3 was formed in the same pattern as the wiring film, there is no possibility of shorting between the wiring films; therefore, there is no need for removal and this step does not exist.

After that, the dam 18 to prevent the resin from flowing at the time of resin sealing with a resin is formed by screen printing on the plane from which the nickel film 3 has been removed. This dam 18 is formed in a ring form on the peripheral part of the resin sealing region of the semiconductor chip to be bonded later.

Figure 7G:
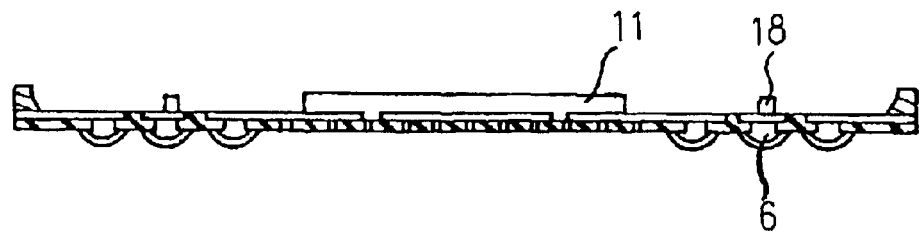
FIGS. 7G to 7I are sectional views sequentially showing steps (G) to (I) of the third example of the production process of the semiconductor device according to the present invention.

(G) Next, as shown in FIG. 7G, the anisotropic conducting film 11 is bonded.

Figure 7H:
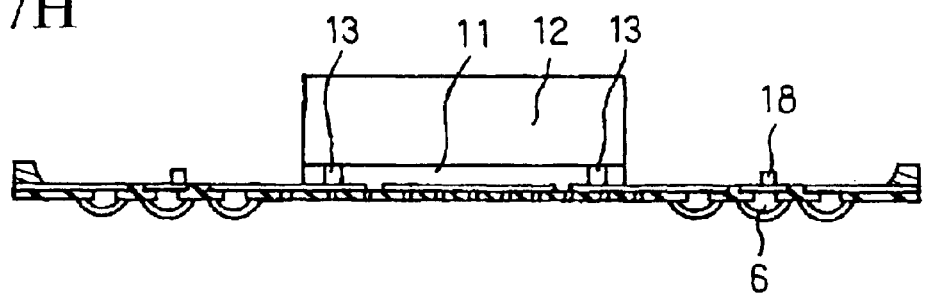

(H) Next, as shown in FIG. 7H, the semiconductor chip 12 provided with the metal bumps 13 is electrically connected to (the nickel film 3) of the wiring film 4 through said anisotropic conducting film 11.

Figure 7I:
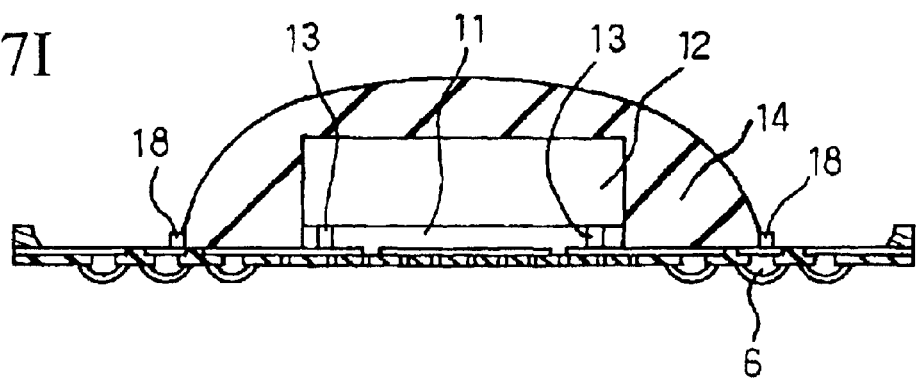

(I) Next, as shown in FIG. 7I, the liquid resin 14 is cast onto the PKG external lead electrode and cured. The semiconductor device shown in this FIG. 7I is the third example of the semiconductor device of the present invention.

The third example of the semiconductor device of the present invention also enjoys the same effect as the first and second examples of the semiconductor device of the present invention; and the third example of the process for production of semiconductor device of the present invention also enjoys the same effect as the first and second examples of the production process of the semiconductor device of the present invention.

Incidentally, in the third example of the production process of the semiconductor device of the present invention, there can be a variation in which the metal substrate 1 is one which does not have the nickel film 3 on the surface in the same way as in the first and second examples.

In the following, other further examples of the semiconductor device of the present invention will be explained individually. FIGS. 8A to 8F, FIGS. 9A to 9E, FIGS. 10A to 10F, FIGS. 11A to 11F, and FIGS. 12A to 12D are sectional views each showing other examples than the first to third examples of the semiconductor device of the present invention.

Figure 8A:
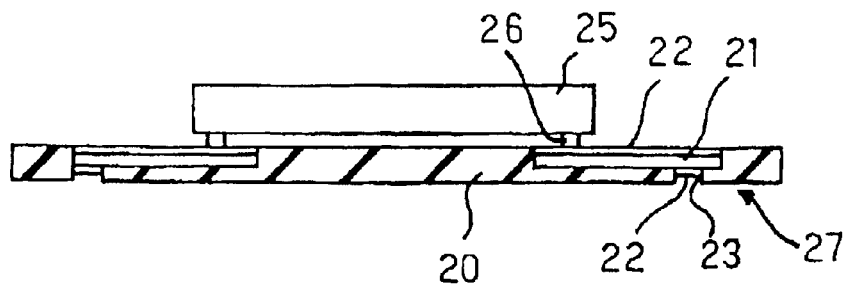
FIGS. 8A to 8F are sectional views showing the semiconductor devices according to the present invention in each of other examples.

The semiconductor device shown in FIG. 8A is the most primitive example pertaining to the first claim. In the FIG., 20 is a base which is made of an insulating resin and constitutes the base metal of the wiring substrate 27; 21 is a wiring film formed in the embedded state in one surface of the base 20; it is made of, for example, copper, and a plating film 22 of, for example, gold is formed on its surface. The wiring film 21 is embedded in such a way that its surface is approximately flush with said one surface of the base 20. 23 is an electrode forming hole which is formed in said base 20, and it permits the reverse side (another surface) of the wiring film 21 to be partly exposed. And the external electrode is formed here.

25 is a semiconductor chip; on its each external lead electrode is formed the bump 26. And, said semiconductor chip 25 is flip-chip-connected to the wiring substrate 27 by connecting the each bump 26 to the wiring film 21. Incidentally, the bump 26 may be formed at first on the external lead electrode of the semiconductor chip 25 or may be formed previously at the wiring film 21 side of the wiring substrate 27. In the later semiconductor devices, too, this is the same in principle. And, the electrical connection through the bump 26 between the external lead electrode of the semiconductor chip 25 and the wiring substrate 27 is accomplished by, for example, by heating under pressure or ultrasonic wave vibration. Although we will explain later the example of making electrical connection between the semiconductor chip and the wiring film by using an anisotropic conducting film or anisotropic conducting resin, in the case of production of this semiconductor device, flip chip connection of the semiconductor chip is accomplished by not using the anisotropic conducting film or anisotropic conducting resin.

In the case of not using an anisotropic conducting film or anisotropic conducting resin, the bump is formed on the external lead electrode of the semiconductor chip or on the wiring film (by stud bump or plating), in the case of heating under pressure, it is accomplished by heating under pressure (connection is possible by heating the semiconductor chip at 200 to 400° C., heating the substrate side at normal temperature to about 150° C., pressing with 10 to 100 gf for one bump, for 1 to several tens (s) seconds). In the case where US (ultrasonic wave) vibration is used, the condition of heating-pressing ultrasonic wave is, for example, the condition that pressing is 10 to 100 g for one bump, heating is normal temperature to 200° C., time is 100 ms to 5 s, US power is 50 mW to 50 W.

Incidentally, in the case where electrical connection is accomplished by ultrasonic wave vibration, the structure of the wiring substrate 27 in which the wiring film 21 is formed in embedded state in the base 20 is effective in ease with which connecting work is carried out and improvement of connecting properties. The reason is that since the vibration direction of ultrasonic wave vibration is the plane direction of the wiring substrate 27, the wiring film 21 which receives the vibration is embedded in the base 20, moving in the lateral direction is strongly restricted by the base 20, as the result, the ultrasonic wave vibration effectively contributes to connection.

According to the semiconductor device like this, the wiring film 21 is positioned in the base 20 of the wiring substrate 27 such that said base 20 is flush with one surface of the wiring film 21, the thickness of the wiring substrate 27 can be made thin, and since the semiconductor chip 25 is flip-chip-connected, it is possible to make remarkably thin the semiconductor device.

Figure 8B:
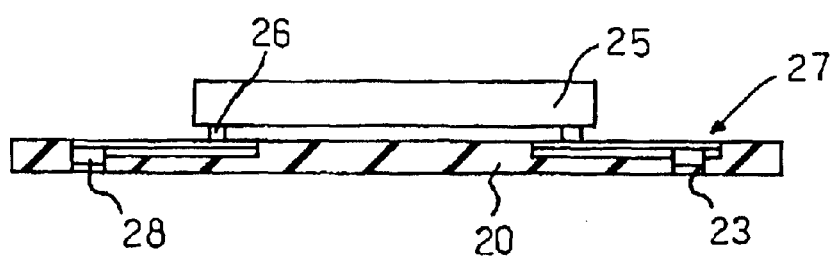

The semiconductor device shown in FIG. 8B is one in which the external electrode 28 is formed on the part exposed to the aforesaid electrode connecting hole 23 of the aforesaid wiring film 21 of the semiconductor device shown in FIG. 8A.

With this external electrode 28, said semiconductor device is mounted on, for example, the printed wiring board etc.

Figure 8C:
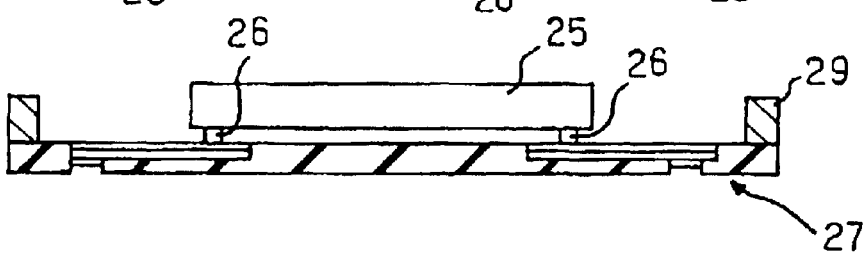

The semiconductor device shown in FIG. 8C is one in which the ring 29 of metal, for example, copper, is formed on the periphery of the plane of the wiring film forming side of the base 20 of the semiconductor device shown in FIG. 8A; said ring 29 is formed in the process of being produced in the same way as the semiconductor device shown in FIGS. 1A to 1E and FIGS. 2F to 2I. Said ring 29 plays a role of reinforcement and as the dam to dam up the sealing resin.

Figure 8D:
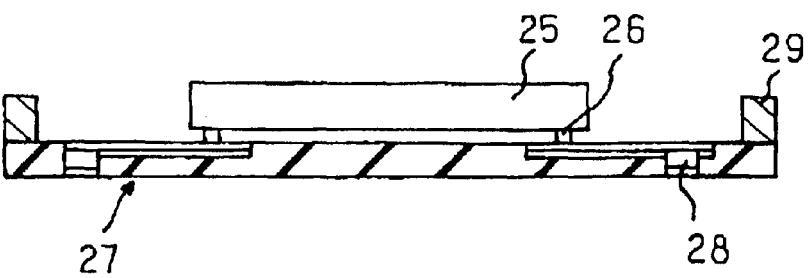
Figure 8E:
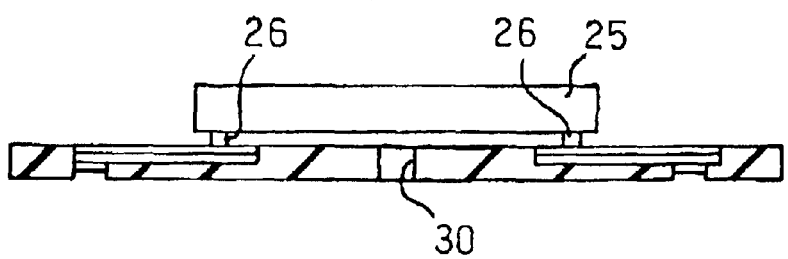

The semiconductor device shown in FIG. 8D is one in which the external electrode 28 is formed in the same way as the semiconductor device of FIG. 8B after the semiconductor device shown in FIG. 8C has been formed. The semiconductor device shown in FIG. 8E is one in which the hole 30 is formed in the part where the wiring film 21 of the base 20 is not formed. Said hole 30 plays the same role as the gas vent hole 10 of the semiconductor device produced by the production method shown in FIGS. 1A to 1E, FIGS. 2F to 2I.

Figure 8F:
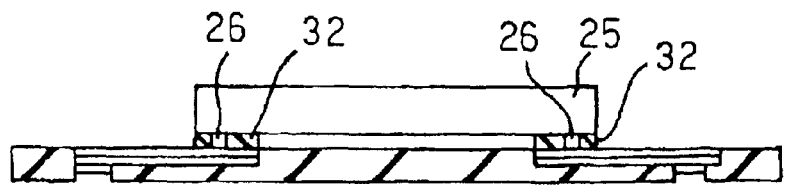

The semiconductor device shown in FIG. 8F is one in which the surrounding of each bump 26 connecting the gap between the semiconductor chip 25 and the wiring substrate 27 of the semiconductor device shown in FIG. 8A is sealed with the resin 32. By this it is possible to seal the bump 26 to connect the gap between the semiconductor chip 25 and the wiring substrate 27, prevent the deterioration of that part, and thereby improve reliability.

Figure 9A:
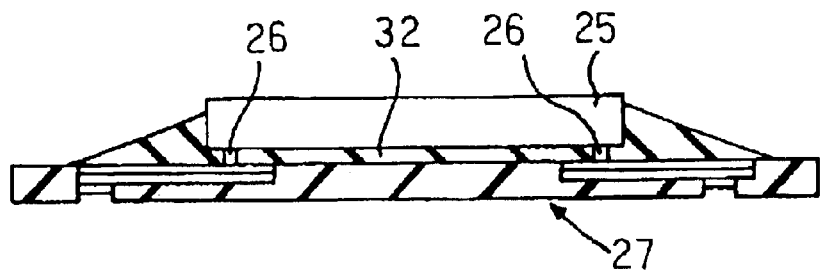
FIGS. 9A to 9E are sectional views showing other variations of the semiconductor device according to the present invention.

The semiconductor device shown in FIG. 9A is one in which the resin 32 to seal the part between the semiconductor chip 25 and the wiring substrate 27 is provided in the semiconductor device shown in FIG. 8A, thereby protecting the surface of the semiconductor chip 25.

Incidentally, the resin 32 can be cast by using the underfilm after flip chip connection. In this case, a desirable method is that, at first, the resin is cast into the gap between the chip and the wiring substrate, and after curing, cast also into other part, for example, the part corresponding to the external lead electrode of the package. Indeed, it is all right to supply the resin to the gap between the semiconductor device and the substrate and its surrounding at one time. Showing the production procedure of the semiconductor device shown in FIG. 9A, as the semiconductor chip 25, the one in which the bump is formed on the external lead electrode is formed is made ready, said semiconductor chip 25 is electrically and mechanically connected to the aforesaid wiring film 21 by ultrasonic wave or heating under pressure, thereby performing flip chip connection, casting in the vicinity of at least bump 26 or between the semiconductor chip 25 and the wiring substrate 27, and subsequently casting the resin. Incidentally, one wiring substrate 27 is usually formed integrally with a plurality of semiconductor devices, and in this case, after prescribed steps have been completed, the substrate is cut by dicing or cut by laser beam or the like, thereby divided.

Figure 9B:
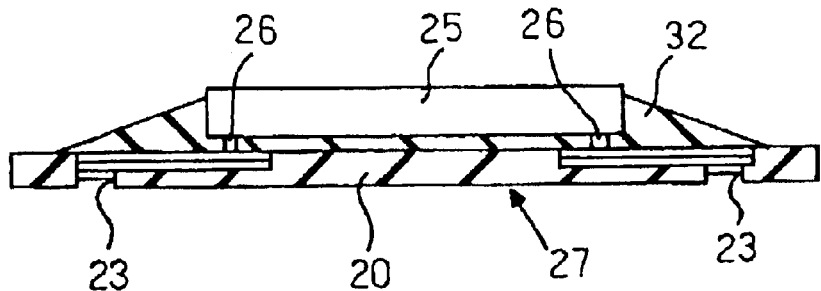

The semiconductor device shown in FIG. 9B is such that the resin 32 not only seals the part between the semiconductor chip 25 and the wiring substrate 27 thereby protecting the surface of the semiconductor chip 25 but also covers up to above the part corresponding to the electrode forming hole 23 (the part where the external lead electrode is formed) of the wiring substrate 27. By this it is possible to increase the region to be sealed with the resin 32.

Figure 9C:
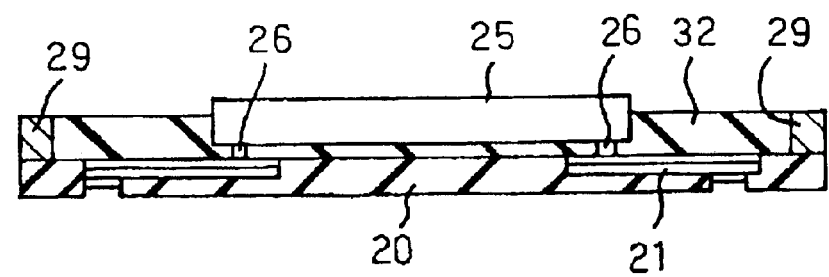

The semiconductor device shown in FIG. 9C is one in which the resin 32 is formed to seal the plane of the wiring film forming side of the wiring substrate 27 including between the semiconductor chip 25 and the wiring substrate 27 in the region surrounded by the ring 29 in the semiconductor device shown in FIG. 8C; it is possible to protect the surface of the wiring film forming side of the wiring substrate 27 more effectively than the semiconductor device shown in FIG. 9A and FIG. 9B, and to dam up the resin 32 by the ring 29 thereby effectively prevent said resin 32 from overflowing to the outside.

Figure 9D:
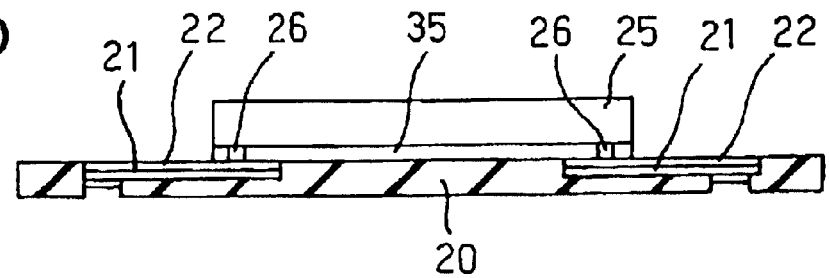

The semiconductor device shown in FIG. 9D is one in which the external lead electrode of the semiconductor chip 25 and the wiring film 21 of the wiring substrate 27 are electrically connected through the anisotropic conducting film or anisotropic conducting resin 35. It is possible to perform flip chip connection by using the anisotropic conducting film or anisotropic conducting resin 35 in place of ultrasonic wave vibration of heat-pressing.

Figure 9E:
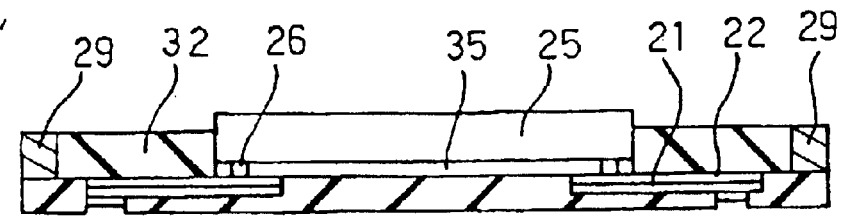

The semiconductor device shown in FIG. 9E is one in which the ring 29 is added to the semiconductor device shown in FIG. 9D and further the resin 32 is sealed in the gap between the semiconductor chip 25 flip-chip-connected to the wiring substrate 27 by the anisotropic conducting film or anisotropic conducting resin 35 and the ring 29.

Figure 10A:
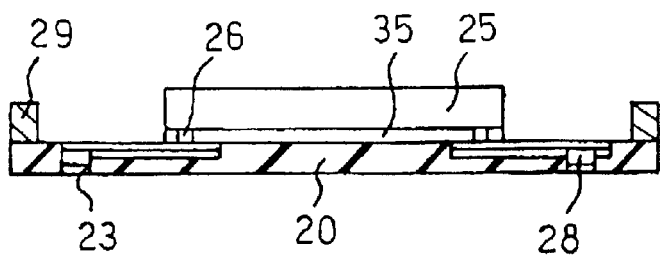
FIGS. 10A to 10F are sectional views showing other variations of the semiconductor device according to the present invention.

The semiconductor device shown in FIG. 10A is one in which the external electrode 28 of copper is formed in the electrode forming hole 23 of the wiring film 21, it has the ring 29, and the flip chip connection of the semiconductor chip 25 was accomplished by the anisotropic conducting film or anisotropic conducting resin 35. Incidentally, the anisotropic conducting film is one which has electrically conductive fine particles of about several $\mu$m dispersed in the film-like resin, the connection of the semiconductor chip by using such anisotropic conducting film is, at first, pasting the anisotropic conducting film to the substrate side (at this time it is possible to neatly paste if pressed with heating at about 50 to 150° C.), on it the semiconductor chip with the bump is aligned (alignment between the bump and the wiring film), pressing, heating, after that, in order to cure the resin of the anisotropic conducting film, heating (150 to 300° C.), pressing (10 to 1000 g/mm² per unit) for about 20 to 60 s (seconds), are carried out. At this time, since it is possible to insert conducting particles between the bump and the wiring film of the substrate, it is possible to obtain conductivity.

Incidentally, it is all right to use the anisotropic conducting resin in place of the anisotropic conducting film. In this case, the resin is previously applied to the substrate, on this, the semiconductor chip with the bump is aligned with the bump and the wiring film of the wiring substrate side and pressing and heating, thereby mounting on the wiring substrate by flip, after that, in order to cure the resin, heating (150 to 300° C.) and pressing (10 to 1000 g/mm² per unit) are performed for about 20 to 60 s. At this time, since it is possible to insert conducting particles between the bump and the wiring film of the substrate, it is possible to obtain conductivity.

Incidentally, in the foregoing case, a resin such as underfilm in place of the anisotropic conducting resin is acceptable. After resin application, the bump and the wiring film are connected by ultrasonic wave and after that resin curing may be performed.

Figure 10B:
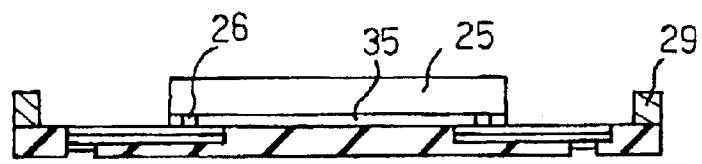

The semiconductor device shown in FIG. 10B is one which has the ring 29 and in which the flip chip connection of the semiconductor chip 25 is accomplished by the anisotropic conducting film or anisotropic conducting resin 35, and differs from that shown in FIG. 10A only in that it does not possess the external electrode 28.

Figure 10C:
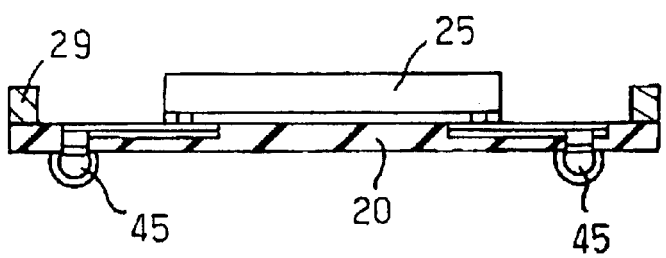
Figure 10D:
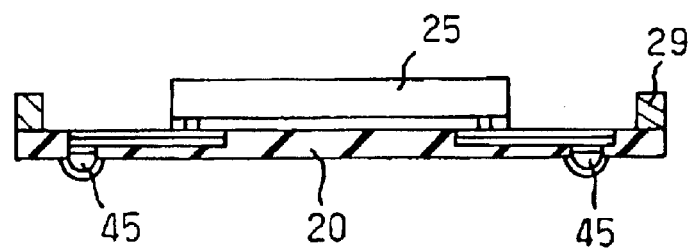

The semiconductor device shown in FIG. 10C is one in which the micro solder ball electrode 45 is formed in the electrode forming hole 23 of the semiconductor device shown in FIG. 10A; the semiconductor device shown in FIG. 10D is one in which the micro solder ball electrode 45 is formed in the electrode forming hole 23 of the semiconductor device shown in FIG. 10B.

Figure 10E:
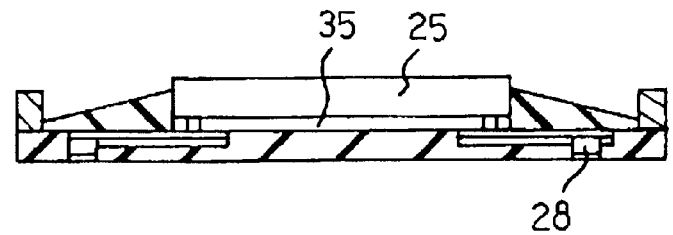

The semiconductor device shown in FIG. 10E is one which has the ring 29 in the wiring substrate 27 and in which the flip chip connection of the semiconductor chip 25 is accomplished by using the anisotropic conducting film or anisotropic conducting resin 35, the external electrode 28 of copper is formed in the electrode forming hole 23 of the wiring film 21, and the flip chip connection part of the aforesaid semiconductor chip 25 is sealed from its surrounding. To be concrete, the bump 26 is previously formed on the semiconductor chip 25, the anisotropic conducting film is previously pasted to the wiring substrate 27 side (or the anisotropic conducting resin is previously applied), aligning each bump 26 of the semiconductor chip 25 with the wiring film 21 and heating under pressure said semiconductor chip 25 to the wiring substrate 27 through the anisotropic conducting film, thereby performing flip chip connection.

Figure 10F:
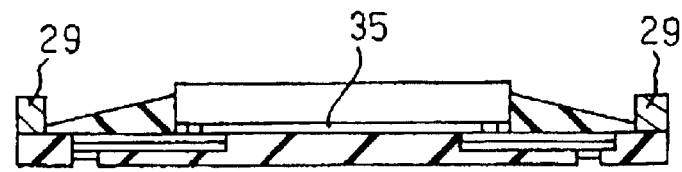

The semiconductor device shown in FIG. 10F is different from the semiconductor device shown in FIG. 10E only in that the external electrode 28 does not exist and is identical in other respects.

Figure 11A:
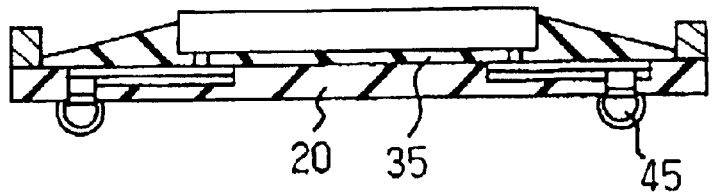
FIGS. 11A to 11F are sectional views showing other variations of the semiconductor device according to the present invention.
Figure 11B:
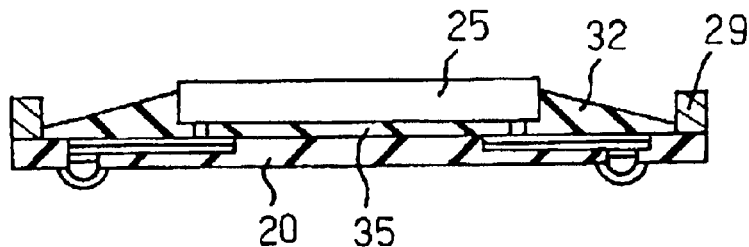

The semiconductor device shown in FIG. 11A is one in which the micro solder ball electrode 45 is formed in the electrode forming hole 23 of the semiconductor device shown in FIG. 10E; the semiconductor device shown in FIG. 11B is one in which the micro solder ball electrode 45 is formed in the electrode forming hole 23 of the semiconductor device shown in FIG. 10F.

Figure 11C:
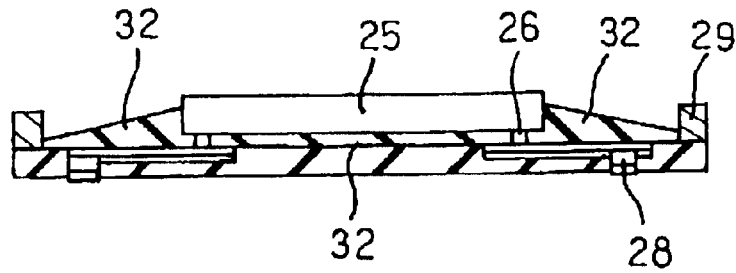

The semiconductor device shown in FIG. 11C is identical with the semiconductor device shown in FIG. 10E except that the semiconductor chip 25 is flip-chip-connected by heating under pressure or ultrasonic wave vibration, the resin 32 is allowed to exist between the semiconductor chip 25 and the wiring substrate, the chip 25 surface is resin sealed.

Figure 11D:

The semiconductor device shown in FIG. 11D is identical with the semiconductor device shown in FIG. 11C except that the external electrode 28 is not formed.

Figure 11E:
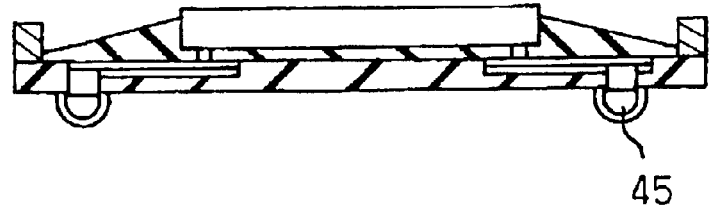
Figure 11F:
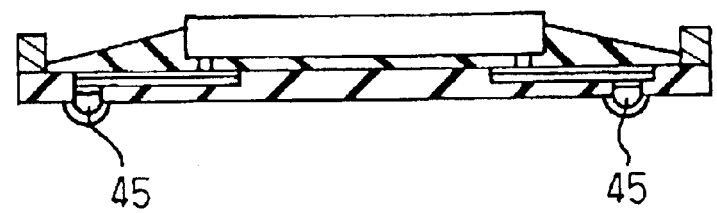

The semiconductor device shown in FIG. 11E is one in which the micro solder ball electrode 45 is formed in the electrode forming hole 23 of the semiconductor device shown in FIG. 10C; the semiconductor device shown in FIG. 11F is one in which the micro solder ball electrode 45 is formed in the electrode forming hole 23 of the semiconductor device shown in FIG. 10D.

Figure 12A:
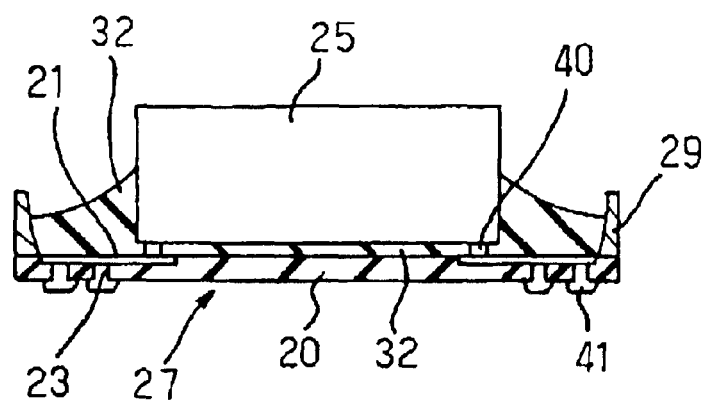
FIGS. 12A to 12D are sectional views showing other variations of the semiconductor device according to the present invention.

The semiconductor device shown in FIG. 12A is one in which the external lead electrode of the semiconductor chip 25 is connected to the wiring film 21 of the wiring substrate 27 through, for example, the bump 26, thereby performing flip chip connection of the semiconductor chip 25, the semiconductor chip 25 is such that the region surrounded by the ring 29 of the surface of the wiring film forming side of the wiring substrate 27 including the part to which the semiconductor chip 25 is flip-chip-connected is resin-sealed, the external lead electrode 41 formed in the electrode forming hole 23 is provided in fan-out (the place corresponding to the place deviating outside from the semiconductor chip 25).

Figure 14:
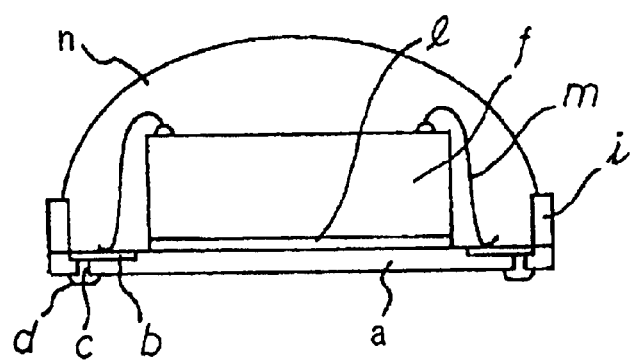
FIG. 14 is a sectional view showing one conventional example.
Figure 15:
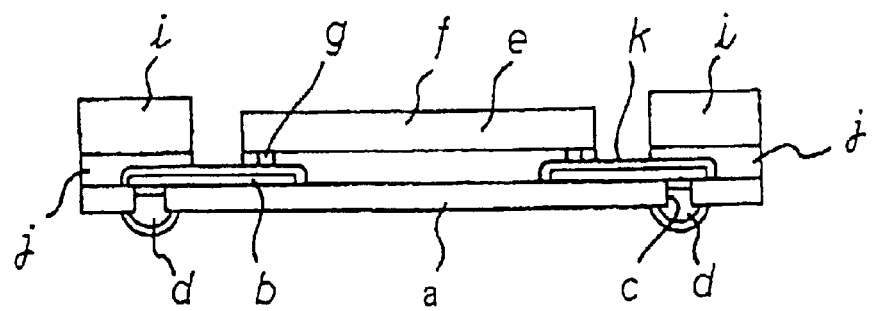
FIG. 15 is a sectional view showing another conventional example.

The semiconductor device shown in FIG. 12A is also the wiring bonding type as shown in FIG. 14, and is the same in that compared with the semiconductor device of CPS package type it is easier to make thin the package thickness.

Figure 12B:
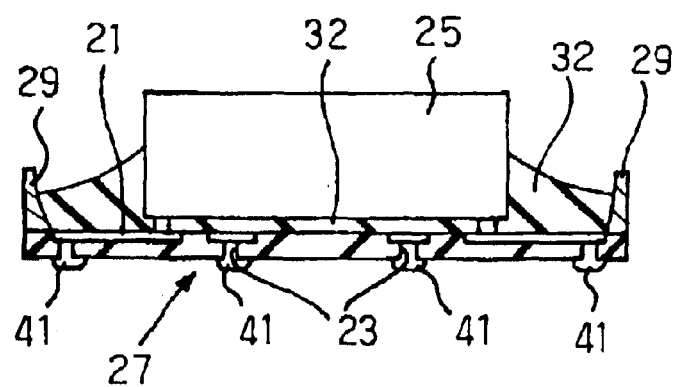

The semiconductor device shown in FIG. 12B is different from the semiconductor device shown in FIG. 12A in that the external lead electrode 41 formed in the electrode forming hole 23 is provided not only in fan-out but also in fan-in (in the region corresponding to the semiconductor chip 25) but is identical in other respects.

Incidentally, the semiconductor device shown in FIG. 12B and the semiconductor device shown in FIG. 12A have the land part less liable to solder bond breakage at the time of mounting of the semiconductor device as compared with the semiconductor device of conventional wiring bonding type shown in FIG. 14. The reason is that in the case of the semiconductor device shown in FIG. 14, if the land is positioned also in the fan-in, as compared with the thermal expansion of the mounted substrate at the time of T/C test, the thermal change of the land part is small (since the land part is just below the semiconductor chip of silicon, the thermal change depends on the thermal expansion change of silicon. The coefficient of thermal expansion of silicon is about $1\times10^{-6}$ and is smaller than the coefficient of thermal expansion of the substrate which is $2\times10^{-5}$.) The solder bond part of the land part is liable to breaking.

Figure 12C:
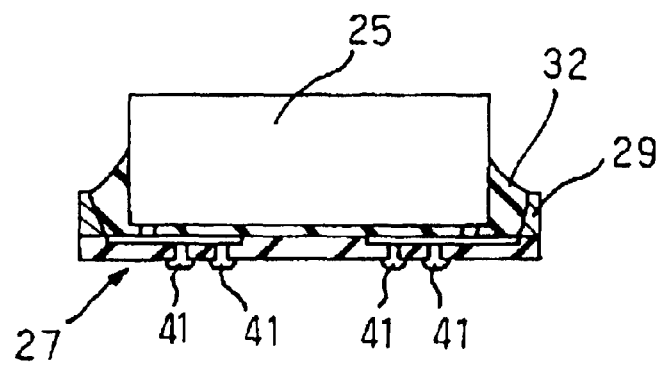
Figure 12D:
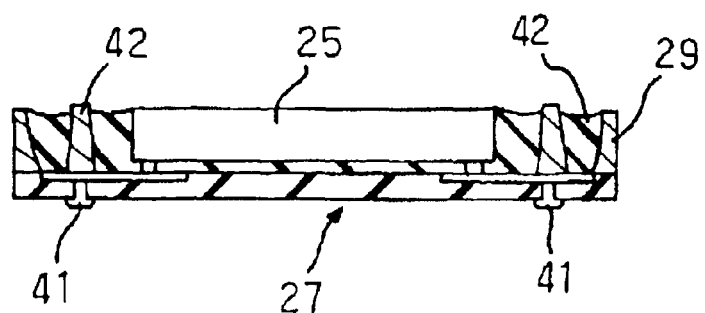

By contrast, the semiconductor device shown in FIG. 12A to FIG. 12B (the semiconductor device shown in FIG. 12C to FIG. 12D given later) has the resin 32 interposed between the wiring substrate 27 and the semiconductor chip 25 and hence stress relaxation by said resin 32 is performed and the solder bond breakage does not occur.

The semiconductor device shown in FIG. 12C is one in which all of the electrodes 41 are provided in fan-in, this offers the advantage that the package size can be made approximately the chip size.

The semiconductor device shown in FIG. 12D is one in which, at the side where the ring 29 of the wiring substrate 27 is formed, the connecting piece 42 for lamination is provided in the intermediate part of said ring 29 and the semiconductor chip 25, it is good to plate the top of said connecting piece 42. And, it is possible to connect another semiconductor device (for example, the semiconductor device shown in FIG. 12D) through said connecting piece 42, thereby to obtain semiconductor devices of high degree of integration in which a plurality of semiconductor chips are laminate-arranged. To be concrete, it is possible to laminate a large number by an embodiment in which the connecting piece 42 of one semiconductor device is connected to the electrode of another semiconductor device.

Incidentally, as the forming method of plating for the connecting piece 42, there is first the method of performing selective plating by using a mask before performing selective etching the metal base material, forming the mask film, after that, selectively etching the metal base material using said mask film as a mask. There is also the second method of selectively forming a mask film before performing selective etching on the base material, forming plating film using said mask film as a mask, after that, performing selective etching on the metal base material using said plating film as a mask. Further, there is the third method of plating the entire body once again by electroless plating after the substrate is completed.

In the production of the above-mentioned each semiconductor device, it is good to increase productivity by adopting the method that a plurality of semiconductor devices are formed on one wiring substrate and divided into individual semiconductor devices by cutting by dicing or cutting with a laser beam the connecting part between individual semiconductor devices of the package.

Figure 13:
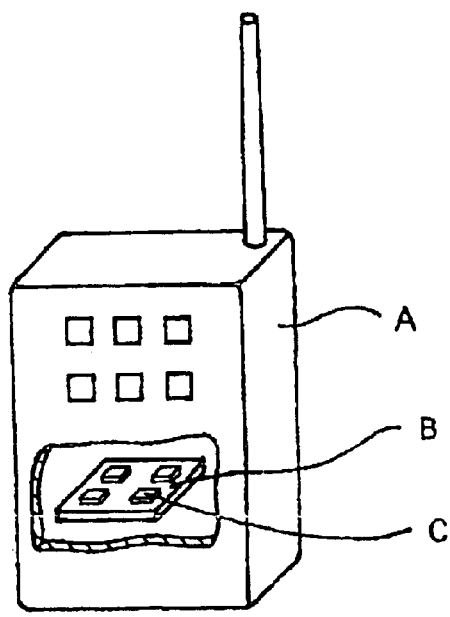
FIG. 13 is a partly cut-away perspective view showing the electronic equipment provided with the semiconductor device of the present invention.

The above-mentioned each semiconductor device can be used for various electronic equipment, greatly contributes to miniaturization when used for, for example, portable telephones etc. which particularly need miniaturization. And, such electronic equipment can be produced by using the semiconductor devices having the above-mentioned advantages by the production method of the semiconductor device having the above-mentioned advantages, hence it is possible to enjoy the advantage of its production method. FIG. 13 shows one example A (portable telephone) of such electronic equipment; in its inside there exists the semiconductor device C pertaining to the present invention which is mounted on the mother board B, and it constitutes at least a part of the internal circuit of the electronic equipment.

According to the present invention, since the wiring film is formed in embedded form in one surface part of the base, it is possible to eliminate the steps of the surface, since the semiconductor chip is mounted on such a surface by flip chip, it is possible to make thin the thickness of the semiconductor device.

And, since the electrode forming hole can be formed by the exposure and development of the base, it is possible to contrive miniaturization and densification of integration and in turn it is possible to increase the degree of integration and the number of electrodes in semiconductor devices.

What is claimed is:

1. A semiconductor device characterized in that it comprises a wiring substrate and a semiconductor chip, said wiring substrate having a wiring film and an insulating resin formed thereon such that the former is embedded in one surface of the latter, with one surface of the former being flush with said one surface of the latter, said wiring substrate further having a hole at the position where at least part of said wiring film overlaps with said insulating resin, said semiconductor chip having at least part of its external lead electrodes connected to said wiring film on said wiring substrate through bumps.

2. A semiconductor device as defined in claim 1, which has, in the part where said hole of said insulating resin is formed, an external electrode projecting to the surface of the side opposite to said one surface of the insulating resin.

3. A semiconductor device as defined in claim 1 or 2, wherein a ring of metal is bonded to the peripheral part of the side on which said wiring film of said insulating resin is formed.

4. A semiconductor device as defined in claim 3, wherein at least vicinity of said bump of said semiconductor chip is scaled with a resin.

5. A semiconductor device as defined in claim 4, wherein the part between said semiconductor chip and said wiring substrate is sealed with a resin.

6. A semiconductor device as defined in claim 5, wherein the top of the part corresponding to the external electrode of said wiring film forming side of said wiring substrate is also sealed with a resin.

7. A semiconductor device as defined in claim 6, wherein a ring of metal is bonded to the peripheral part of the side on which said wiring film of said insulating resin is formed, and the part between said ring and said semiconductor chip is buried with a resin.

8. A semiconductor device as defined in claim 7, wherein the electrical connection through the bump between the external lead electrode of said semiconductor chip and the wiring film of said wiring substrate is accomplished through an anisotropic conducting film or anisotropic conducting resin.

9. A semiconductor device as defined in claim 7, wherein the electrical connection through the bump between the external lead electrode of said semiconductor chip and the wiring film of said wiring substrate is accomplished by connection using ultrasonic wave.

10. A semiconductor device as defined in claim 7, wherein the electrical connection through the bump between the external lead electrode of said semiconductor chip and the wiring film of said wiring substrate is accomplished by heating under pressure.

11. A semiconductor device as defined in claim 7, wherein the electrical connection through the bump between the external lead electrode of said semiconductor chip and the wiring film of said wiring substrate is accomplished by means of solder.

12. A semiconductor device as defined in claim 7, wherein the electrical connection through the bump between the external lead electrode of said semiconductor chip and the wiring film of said wiring substrate is accomplished by means of an electrically conductive resin.

13. A process for producing a semiconductor device characterized in that it comprises the steps of providing a wiring substrate which is so formed as to permit a plurality of semiconductor chips to be mounted thereon and a plurality of semiconductor chips each having bumps formed on the external lead electrode, connecting the gap between said bump of said each semiconductor chip and the wiring film of said wiring substrate by ultrasonic wave or heating under pressure, casting a resin into the vicinity of said bumps, thereby sealing it, and finally separating said wiring substrate to give a plurality of semiconductor devices, wherein said wiring substrate having a wiring film and an insulating resin formed thereon such that the former is embedded in one surface of the latter, with one surface of the former being flush with said one surface of the latter.

14. A process for producing a semiconductor device characterized in that it comprises the steps of providing a wiring substrate and a plurality of semiconductor chips mounted thereon, each having bumps formed on the external lead electrode, pasting an anisotropic conducting film to the wiring film forming plane of said wiring substrate, placing the semiconductor chip on said anisotropic conducting film on said wiring substrate, electrically connecting the gap between the bump of said semiconductor chip and said wiring film by heating under pressure, and casting a resin into the vicinity of said semiconductor chip for its sealing, wherein said wiring substrate having a wiring film and an insulating resin formed thereon such that the former is embedded in one surface of the latter, with one surface of the former being flush with said one surface of the latter.

15. A semiconductor device characterized in that it comprises a wiring substrate and a semiconductor chip, said wiring substrate being embedded in said one surface part of said insulating resin such that one surface of the wiring film is positioned flush with one surface of the insulating resin, with a hole formed in the position which overlaps with at least a part of said wiring film of said insulating resin, a connecting piece for lamination is formed outside the semiconductor chip mounting region of said surface of said insulating resin, and an external electrode electrically connected to said wiring film being formed in said hole of the other surface of said insulating resin, said semiconductor chip being mounted on said semiconductor chip mounting region, with at least a part of the external lead electrodes being connected to the external electrode of said wiring substrate through the bump.

16. A semiconductor device characterized in that a plurality of wiring films are formed on one surface part of the base which is formed from an insulating resin and has electrode forming holes such that the surface of said wiring film is flush with the surface of said base and at least a part of said wiring film is so formed as to overlap with the electrode forming hole, said electrode forming holes are filled with a conducting material, external electrodes projecting toward the opposite side of the wiring film are formed, the semiconductor chip is bonded to the reverse side through an insulating material film on one surface of said base, and each wiring film corresponding to it is flip-chip-connected.

17. A semiconductor device as defined in claim 16, wherein the ring of metal is bonded outside the flip-chip-connected part of said semiconductor chip in the wiring film forming plane of the base.

18. A semiconductor device as defined in claim 16 or 17, which has the CSP structure in which the semiconductor device is sealed by chip size package.

19. A semiconductor device as defined in claim 16 or 17, which has the BGA structure in which the semiconductor device is sealed by package of ball grid array type.

20. A semiconductor device as defined in claim 16 or 17, wherein a gas vent hole is formed in the base.

21. A process for producing a semiconductor device characterized in that it comprises the steps of forming on an etch stopping metal film as an underlayer a wiring film by plating using as a mask the mask film selectively formed on one surface of a metal substrate, forming on the surface of the side where said wiring film has been formed on said metal substrate a base of an insulating resin having the electrode forming hole which causes at least part of the wiring film of said wiring film to be exposed, etching from the reverse side the region in which at least the wiring film of said metal substrate is formed until the etch stopping metal film as the underlayer is exposed, and electrically bonding at least part of the external lead electrodes of the semiconductor chip to the wiring film of said wiring substrate.

22. A process for producing a semiconductor device as defined in claim 21, wherein the metal substrate is one in which the etch stopping metal film is laminated on the surface thereof, the formation of the wiring film on the etch stopping metal film as the underlayer is accomplished by selectively forming the mask film on said etch stopping metal film and subsequently performing plating using said mask film as a mask, and after the etching step to cause said etch stopping metal film to be exposed from the reverse side of the region in which at least the wiring film of said metal substrate has been completed, said etch stopping metal film is removed.

23. Electronic equipment containing at least one of the semiconductor devices defined in claims 1, 2, 15, or 16.

24. A semiconductor device as defined in claim 1 or 2, wherein at least vicinity of said bump of said semiconductor chip is sealed with a resin.

25. A semiconductor device as defined in claim 1 or 2, wherein the part between said semiconductor chip and said wiring substrate is sealed with a resin.

26. A semiconductor device as defined in claim 3, wherein the part between said semiconductor chip and said wiring substrate is sealed with a resin.

27. A semiconductor device as defined in claim 25, wherein the top of the part corresponding to the external electrode of said wiring film forming side of said wiring substrate is also sealed with a resin.

28. A semiconductor device as defined in claim 25, wherein the top of the part corresponding to the external electrode of said wiring film forming side of said wiring substrate is also sealed with a resin.

29. A semiconductor device as defined in claim 26, wherein a ring of metal is bonded to the peripheral part of the side on which said wiring film of said insulating resin is formed, and the part between said ring and said semiconductor chip is buried with a resin.

30. A semiconductor device as defined in claim 1 or 2, wherein the electrical connection through the bump between the external lead electrode of said semiconductor chip and the wiring film of said wiring substrate is accomplished through an anisotropic conducting film or anisotropic conducting resin.

31. A semiconductor device as defined in claim 3, wherein the electrical connection through the bump between the external lead electrode of said semiconductor chip and the wiring film of said wiring substrate is accomplished through an anisotropic conducting film or anisotropic conducting resin.

32. A semiconductor device as defined in claim 4, wherein the electrical connection through the bump between the external lead electrode of said semiconductor chip and the wiring film of said wiring substrate is accomplished through an anisotropic conducting film or anisotropic conducting resin.

33. A semiconductor device as defined in claim 5, wherein the electrical connection through the bump between the external lead electrode of said semiconductor chip and the wiring film of said wiring substrate is accomplished through an anisotropic conducting film or anisotropic conducting resin.

34. A semiconductor device as defined in claim 6, wherein the electrical connection through the bump between the external lead electrode of said semiconductor chip and the wiring film of said wiring substrate is accomplished through an anisotropic conducting film or anisotropic conducting resin.

35. A semiconductor device as defined in claim 1 or 2, wherein the electrical connection through the bump between the external lead electrode of said semiconductor chip and the wiring film of said wiring substrate is accomplished by connection using ultrasonic wave.

36. A semiconductor device as defined in claim 1 or 2, wherein the electrical connection through the bump between the external lead electrode of said semiconductor chip and the wiring film of said wiring substrate is accomplished by heating under pressure.

37. A semiconductor device as defined in claim 1 or 2, wherein the electrical connection through the bump between the external lead electrode of said semiconductor chip and the wiring film of said wiring substrate is accomplished by means of solder.

38. A semiconductor device as defined in claim 3, wherein the electrical connection through the bump between the external lead electrode of said semiconductor chip and the wiring film of said wiring substrate is accomplished by means of an electrically conductive resin.

39. A semiconductor device as defined in claim 3, wherein the electrical connection through the bump between the external lead electrode of said semiconductor chip and the wiring film of said wiring substrate is accomplished by connection using ultrasonic wave.

40. A semiconductor device as defined in claim 3, wherein the electrical connection through the bump between the external lead electrode of said semiconductor chip and the wiring film of said wiring substrate is accomplished by heating under pressure.

41. A semiconductor device as defined in claim 3, wherein the electrical connection through the bump between the external lead electrode of said semiconductor chip and the wiring film of said wiring substrate is accomplished by means of solder.

42. A semiconductor device as defined in claim 3, wherein the electrical connection through the bump between the external lead electrode of said semiconductor chip and the wiring film of said wiring substrate is accomplished by means of an electrically conductive resin.

43. A semiconductor device as defined in claim 5, wherein the electrical connection through the bump between the external lead electrode of said semiconductor chip and the wiring film of said wiring substrate is accomplished by connection using ultrasonic wave.

44. A semiconductor device as defined in claim 4, wherein the electrical connection through the bump between the external lead electrode of said semiconductor chip and the wiring film of said wiring substrate is accomplished by heating under pressure.

45. A semiconductor device as defined in claim 4 wherein the electrical connection through the bump between the external lead electrode of said semiconductor chip and the wiring film of said wiring substrate is accomplished by means of solder.

46. A semiconductor device as defined in claim 4, wherein the electrical connection through the bump between the external lead electrode of said semiconductor chip and the wiring film of said wiring substrate is accomplished by means of an electrically conductive resin.

47. A semiconductor device as defined in claim 5, wherein the electrical connection through the bump between the external lead electrode of said semiconductor chip and the wiring film of said wiring substrate is accomplished by connection using ultrasonic wave.

48. A semiconductor device as defined in claim 5, wherein the electrical connection through the bump between the external lead electrode of said semiconductor chip and the wiring film of said wiring substrate is accomplished by heating under pressure.

49. A semiconductor device as defined in claim 5, wherein the electrical connection through the bump between the external lead electrode of said semiconductor chip and the wiring film of said wiring substrate is accomplished by means of solder.

50. A semiconductor device as defined in claim 5, wherein the electrical connection through the bump between the external lead electrode of said semiconductor chip and the wiring film of said wiring substrate is accomplished by means of an electrically conductive resin.

51. A semiconductor device as defined in claim 6, wherein the electrical connection through the bump between the external lead electrode of said semiconductor chip and the wiring film of said wiring substrate is accomplished by connection using ultrasonic wave.

52. A semiconductor device as defined in claim 6, wherein the electrical connection through the bump between the external lead electrode of said semiconductor chip and the wiring film of said wiring substrate is accomplished by heating under pressure.

53. A semiconductor device as defined in claim 6, wherein the electrical connection through the bump between the external lead electrode of said semiconductor chip and the wiring film of said wiring substrate is accomplished by means of solder.

54. A semiconductor device as defined in claim 6, wherein the electrical connection through the bump between the external lead electrode of said semiconductor chip and the wiring film of said wiring substrate is accomplished by means of an electrically conductive resin.

55. A semiconductor device as defined in claim 18, wherein a gas vent hole is formed in the base.

56. A semiconductor device as defined in claim 19, wherein a gas vent hole is formed in the base.

* * * * *

UNITED STATES PATENT AND TRADEMARK OFFICE
CERTIFICATE OF CORRECTION

PATENT NO.    : 6,794,739 B2
DATED         : September 21, 2004
INVENTOR(S)   : Hirotaka Kobayashi et al.

It is certified that error appears in the above-identified patent and that said Letters Patent is hereby corrected as shown below:

Column 21,
Line 11, "scaled" should read -- sealed --.

Signed and Sealed this

Eleventh Day of October, 2005

JON W. DUDAS
*Director of the United States Patent and Trademark Office*